United States Patent
Kim et al.

(10) Patent No.: US 12,489,071 B2
(45) Date of Patent: Dec. 2, 2025

(54) SEMICONDUCTOR CHIP AND SEMICONDUCTOR PACKAGE INCLUDING BONDING LAYERS HAVING ALIGNMENT MARKS

(71) Applicant: Samsung Electronics Co., Ltd., Suwon-si (KR)

(72) Inventors: Hyoeun Kim, Cheonan-si (KR); Juhyeon Kim, Cheonan-si (KR); Wonil Lee, Hwaseong-si (KR); Youngkun Jee, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 572 days.

(21) Appl. No.: 17/873,990

(22) Filed: Jul. 26, 2022

(65) Prior Publication Data
US 2023/0119548 A1 Apr. 20, 2023

(30) Foreign Application Priority Data
Oct. 14, 2021 (KR) .................. 10-2021-0136360

(51) Int. Cl.
*H01L 23/00* (2006.01)
*H01L 23/544* (2006.01)
*H01L 25/065* (2023.01)

(52) U.S. Cl.
CPC ............ *H01L 24/05* (2013.01); *H01L 23/544* (2013.01); *H01L 24/08* (2013.01);
(Continued)

(58) Field of Classification Search
CPC ....... H01L 25/0657; H01L 2225/06524; H01L 2225/06527; H01L 2225/06541;
(Continued)

(56) References Cited

U.S. PATENT DOCUMENTS 4,887,403 A 12/1989 Bonner
5,311,061 A * 5/1994 Sheck .................. H01L 23/544
257/E23.179
(Continued)

FOREIGN PATENT DOCUMENTS

CN 111933618 A 11/2020
JP 2002213915 A 7/2002
(Continued)

*Primary Examiner* — Kevin Parendo
(74) *Attorney, Agent, or Firm* — Muir Patent Law, PLLC

(57) ABSTRACT

A semiconductor package includes a first semiconductor chip including a first substrate and a first bonding layer disposed on the first substrate, and having a flat first outer surface provided by the first bonding layer; and a second semiconductor chip disposed on the first outer surface of the first semiconductor chip, including a second substrate and a second bonding layer disposed on the second substrate, and having a flat second outer surface provided by the second bonding layer and contacting the first outer surface of the first semiconductor chip. The first bonding layer includes a first outermost insulating layer providing the first outer surface, a first internal insulating layer stacked between the first outermost insulating layer and the first substrate, first external marks disposed in the first outermost insulating layer and spaced apart from each other, and first internal marks interlaced with the first external marks within the first internal insulating layer.

20 Claims, 15 Drawing Sheets

(52) U.S. Cl.
CPC .. *H01L 25/0657* (2013.01); *H01L 2223/5442* (2013.01); *H01L 2223/54426* (2013.01); *H01L 2223/54473* (2013.01); *H01L 2224/0213* (2013.01); *H01L 2224/02141* (2013.01); *H01L 2224/02145* (2013.01); *H01L 2224/0224* (2013.01); *H01L 2224/03015* (2013.01); *H01L 2224/05014* (2013.01); *H01L 2224/05078* (2013.01); *H01L 2224/05541* (2013.01); *H01L 2224/05554* (2013.01); *H01L 2224/05557* (2013.01); *H01L 2224/05559* (2013.01); *H01L 2224/05578* (2013.01); *H01L 2224/08145* (2013.01); *H01L 2224/8013* (2013.01); *H01L 2224/80895* (2013.01); *H01L 2224/80896* (2013.01); *H01L 2224/95121* (2013.01); *H01L 2225/06524* (2013.01); *H01L 2225/06527* (2013.01)

(58) Field of Classification Search
CPC ......... H01L 2225/06544; H01L 23/544; H01L 2224/0217; H01L 2224/0224; H01L 2224/03015; H01L 2223/54426; H01L 2223/54473; H01L 2223/5448; H01L 2223/54486; H01L 2223/5442; H01L 2224/8013; H01L 2224/80895; H01L 2224/80896; H01L 24/80; H01L 2224/08145; H01L 2224/08146; H01L 2224/08147; H01L 2224/08148
See application file for complete search history.

(56) References Cited

U.S. PATENT DOCUMENTS

| | | | | |
|---|---|---|---|---|
| 7,288,836 | B2* | 10/2007 | Chia | G03F 9/7076 |
| | | | | 257/E23.179 |
| 10,157,867 | B1* | 12/2018 | Chen | H01L 23/53233 |
| 2007/0090548 | A1* | 4/2007 | Chia | H01L 23/544 |
| | | | | 257/E23.179 |
| 2009/0206411 | A1* | 8/2009 | Koketsu | H01L 23/544 |
| | | | | 257/E21.048 |
| 2015/0137358 | A1* | 5/2015 | Yanagisawa | H01L 23/481 |
| | | | | 257/737 |
| 2017/0034919 | A1* | 2/2017 | Fournel | H05K 3/30 |
| 2019/0393159 | A1* | 12/2019 | Chen | H01L 24/20 |
| 2020/0159133 | A1* | 5/2020 | Yan | H01L 23/544 |
| 2020/0335473 | A1* | 10/2020 | Zhou | H01L 24/08 |
| 2020/0350258 | A1* | 11/2020 | Lee | H01L 24/80 |
| 2021/0035805 | A1* | 2/2021 | Zhao | H01L 22/20 |
| 2021/0043488 | A1* | 2/2021 | Toshima | H01L 23/544 |
| 2021/0398942 | A1* | 12/2021 | Wang | H01L 23/544 |
| 2022/0085091 | A1* | 3/2022 | Shin | H10F 39/809 |
| 2022/0302078 | A1* | 9/2022 | Chang | H01L 24/83 |
| 2022/0310554 | A1* | 9/2022 | Chen | H01L 21/6835 |

FOREIGN PATENT DOCUMENTS

| | | | |
|---|---|---|---|
| KR | 1020050101998 | A | 10/2005 |
| KR | 1020060108873 | A | 10/2006 |
| KR | 1020200052497 | A | 5/2020 |

* cited by examiner

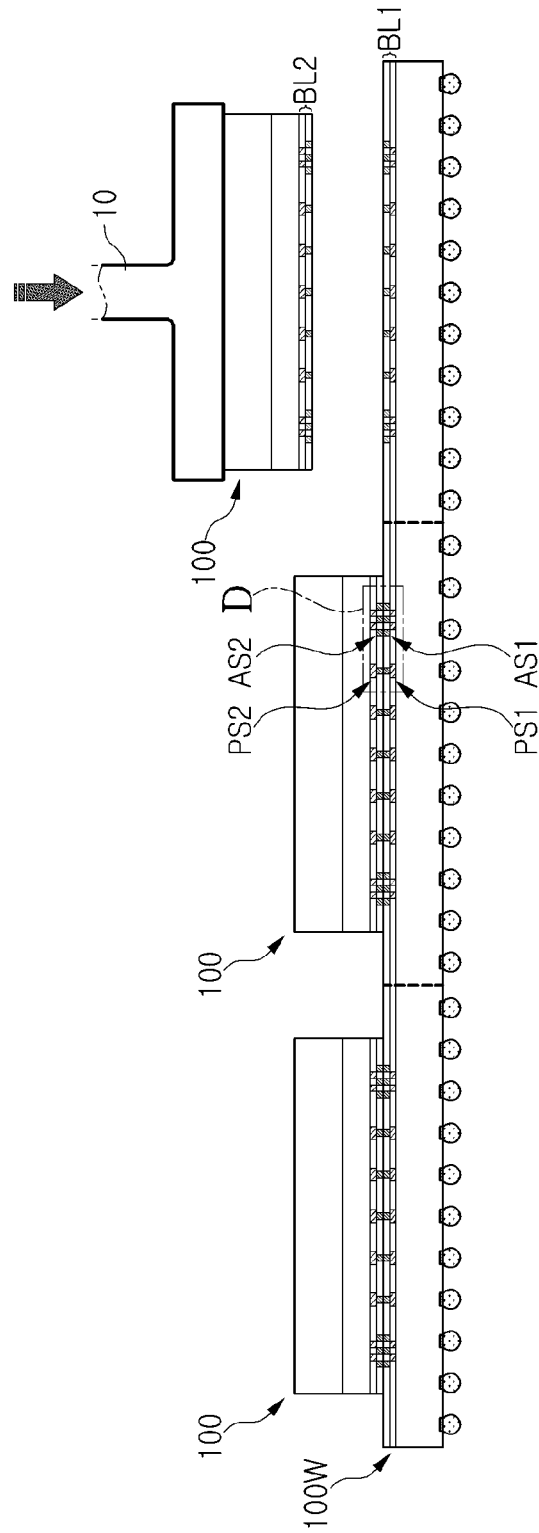

SEMICONDUCTOR CHIP AND SEMICONDUCTOR PACKAGE INCLUDING BONDING LAYERS HAVING ALIGNMENT MARKS

CROSS TO REFERENCE TO RELATED APPLICATION(S)

This application claims benefit of priority to Korean Patent Application No. 10-2021-0136360 filed on Oct. 14, 2021 in the Korean Intellectual Property Office, the disclosure of which is incorporated herein by reference in its entirety.

BACKGROUND

Example embodiments of the present disclosure relate to a semiconductor chip and a semiconductor package.

As demand for high capacity and miniaturization of electronic products has increased, various types of semiconductor packages have been developed. Recently, as a method to integrate a greater number of components (e.g., semiconductor chips) into a package structure, a direct bonding technique of bonding semiconductor chips to each other without an adhesive film (e.g., an NCF) or a connecting bump (e.g., a solder ball) has been developed.

SUMMARY

An example embodiment of the present disclosure includes a semiconductor chip in which dishing of an alignment structure is controlled during a planarization process.

An example embodiment of the present disclosure includes a semiconductor package having reduced voids during a direct bonding process and having improved yield.

According to an example embodiment of the present disclosure, a semiconductor package includes a first semiconductor chip including a first substrate and a first bonding layer disposed on the first substrate, and having a flat first outer surface provided by the first bonding layer; and a second semiconductor chip disposed on the first outer surface of the first semiconductor chip, including a second substrate and a second bonding layer disposed on the second substrate, and having a flat second outer surface provided by the second bonding layer and contacting the first outer surface of the first semiconductor chip, wherein the first bonding layer includes a first outermost insulating layer providing the first outer surface, a first internal insulating layer stacked between the first outermost insulating layer and the first substrate, first external marks disposed in the first outermost insulating layer and spaced apart from each other, and first internal marks interlaced with the first external marks within the first internal insulating layer, wherein the first external marks and first internal marks together form a first alignment structure, and wherein the second bonding layer includes a second outermost insulating layer providing the second outer surface, a second internal insulating layer stacked between the second outermost insulating layer and the second substrate, second external marks disposed in the second outermost insulating layer and spaced apart from each other, and second internal marks interlaced with the second external marks within the second internal insulating layer. The second external marks and second internal marks together form a second alignment structure.

According to an example embodiment of the present disclosure, a semiconductor package includes a first semiconductor chip including a first substrate and a first bonding layer disposed on the first substrate, and having an upper surface provided by the first bonding layer; and a second semiconductor chip disposed on the upper surface of the first semiconductor chip, including a second substrate and a second bonding layer disposed below the second substrate, and having a lower surface provided by the second bonding layer and in contact with the upper surface of the first semiconductor chip, wherein the first bonding layer includes first external marks and a first external pad providing the upper surface, the first external marks and the first external pad electrically insulated from each other, wherein the second bonding layer includes second external marks and a second external pad providing the lower surface, the second external marks and the second external pad electrically insulated from each other, and wherein a difference between a width in the first horizontal direction of the first external marks and a width in the first horizontal direction of the first external pad is 20% or less and a difference between a width in the first horizontal direction of the second external marks and a width in the first horizontal direction of the second external pad is about 20% or less.

According to an example embodiment of the present disclosure, a semiconductor package includes a first semiconductor chip including a first substrate and a first bonding layer disposed on the first substrate, and having a flat upper surface provided by the first bonding layer; and a second semiconductor chip disposed on the upper surface of the first semiconductor chip, including a second substrate and a second bonding layer disposed below the second substrate, and having a lower surface provided by the second bonding layer and contacting the upper surface of the first semiconductor chip, wherein the first bonding layer includes a first alignment structure having first external marks providing the upper surface and first internal marks interlaced with the first external marks below the first external marks, and a first pad structure having a first external pad electrically insulated from the first external marks, and wherein the first alignment structure has a planar area larger than a planar area of the first external pad, when both are projected onto a plane parallel to the upper surface of the first semiconductor chip.

According to an example embodiment of the present disclosure, a semiconductor chip includes a substrate; a circuit layer disposed on the substrate and including a wiring structure and an interlayer insulating layer surrounding the wiring structure; and a bonding layer disposed on the circuit layer and including a pad structure electrically connected to the wiring structure, an alignment structure spaced apart from the pad structure, and an insulating material layer surrounding the pad structure and the alignment structure, wherein a front surface provided by the pad structure, the alignment structure, and the insulating material layer, and a rear surface opposite to the front surface are included, wherein the insulating material layer includes an outermost insulating layer providing the front surface, and one or more internal insulating layers stacked between the outermost insulating layer and the circuit layer, and wherein the alignment structure includes external marks disposed in the outermost insulating layer and spaced apart from each other in a first direction parallel to the front surface, and internal marks disposed in one or more layers and interlaced with the external marks within the one or more internal insulating layers, when viewed from a second direction perpendicular to the front surface.

BRIEF DESCRIPTION OF DRAWINGS

The above and other aspects, features, and advantages of the present disclosure will be more clearly understood from the following detailed description, taken in conjunction with the accompanying drawings, in which:

FIG. 13 is a cross-sectional diagram illustrating a portion of processes of manufacturing a semiconductor package according to an example embodiment of the present disclosure;

DETAILED DESCRIPTION

Hereinafter, embodiments of the present disclosure will be described as follows with reference to the accompanying drawings.

Figure 1A:
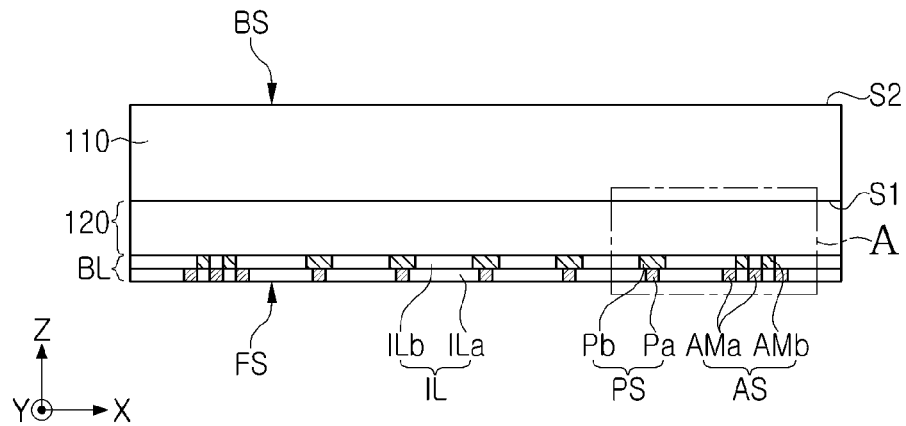
FIG. 1A is a cross-sectional diagram illustrating a semiconductor chip according to an example embodiment of the present disclosure.
Figure 1B:
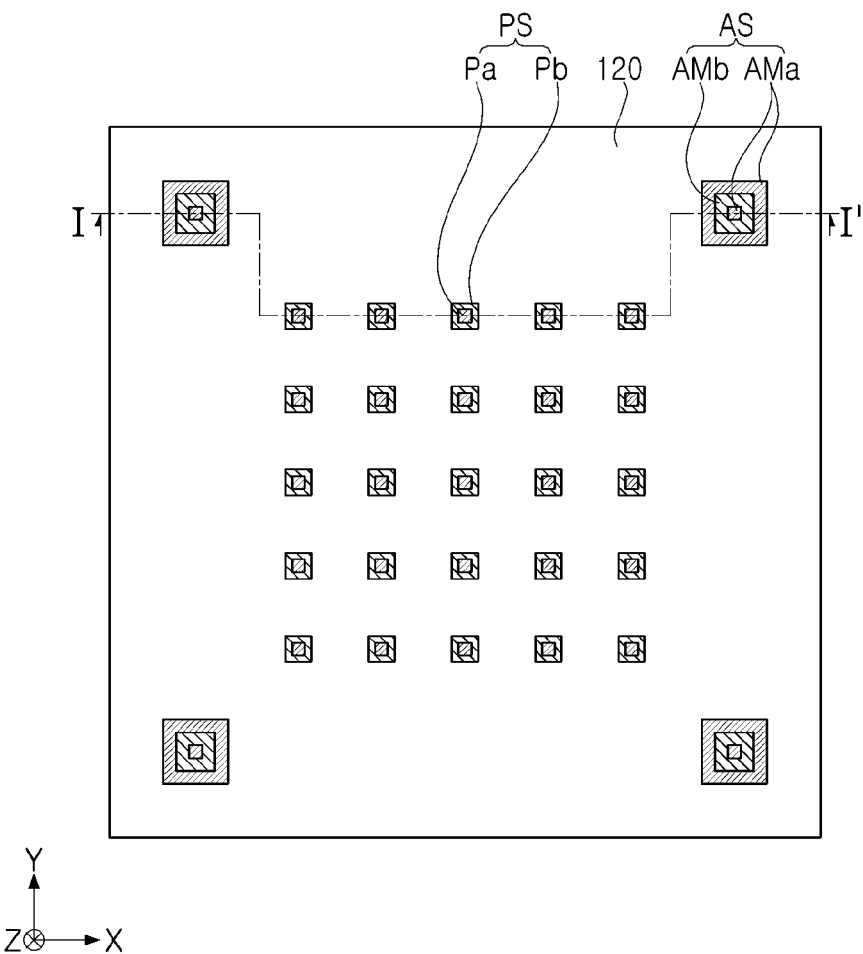
FIG. 1B is a plan diagram illustrating a front surface of the semiconductor chip illustrated in FIG. 1A.
Figure 2:
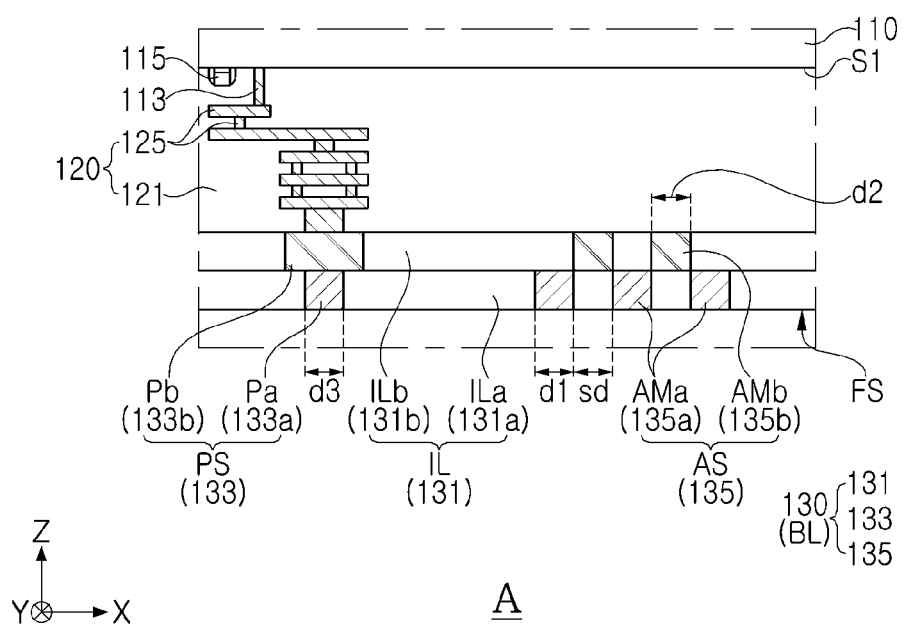
FIG. 2 is an enlarged diagram illustrating region "A" illustrated in FIG. 1A.
Figure 3:
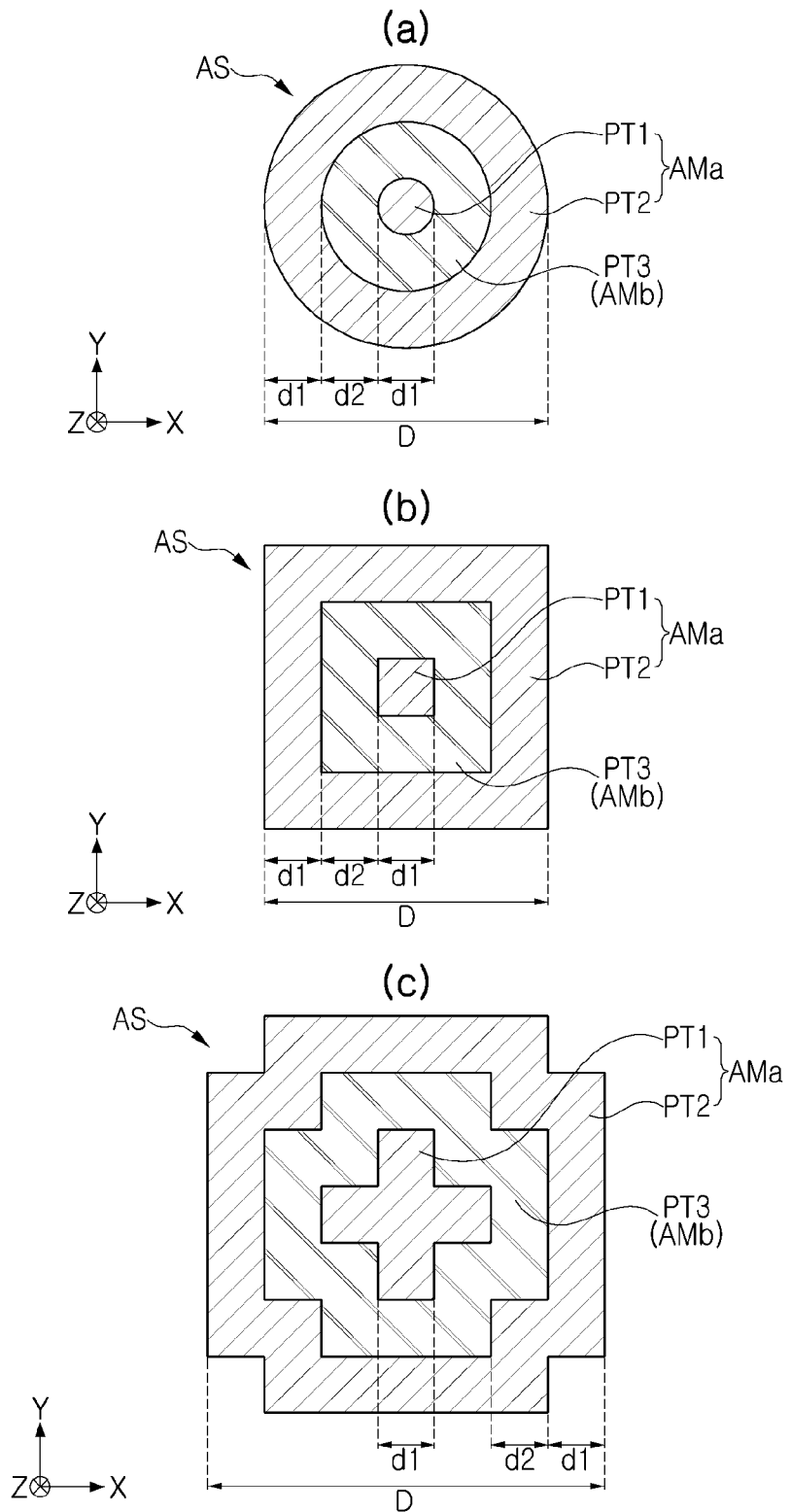
FIG. 3 is a plan diagram illustrating various shapes of an alignment structure according to modified examples of the present disclosure.

FIG. 1A is a cross-sectional diagram illustrating a semiconductor chip 100 according to an example embodiment. FIG. 1B is a plan diagram illustrating a front surface FS of the semiconductor chip 100 illustrated in FIG. 1A. FIG. 2 is an enlarged diagram illustrating region "A" illustrated in FIG. 1A. FIG. 3 is a plan diagram illustrating various shapes of an alignment structure AS according to modified examples. FIG. 1A is a cross-sectional diagram taken along line I-I' in FIG. 1B. FIG. 1B illustrates planar shapes of the alignment structure AS and a pad structure PS, viewed via an insulating material layer IL of FIG. 1A.

Referring to FIGS. 1A and 1B, the semiconductor chip 100 according to an example embodiment may include a substrate 110, a circuit layer 120, and a bonding layer BL. The bonding layer BL may provide a flat surface for bonding and coupling (e.g., hybrid bonding, direct bonding, or the like) with an external device (e.g., a semiconductor chip, a semiconductor substrate, or the like). For example, the bonding layer BL may provide the front surface FS of the semiconductor chip 100, but embodiments thereof are not limited thereto. In example embodiments, the bonding layer BL may be disposed on the second surface S2 of the substrate 110 and may provide a rear surface BS of the semiconductor chip 100 or may be disposed on each of a first surface S1 and a second surface S2 of the substrate 110 and may provide both the front surface FS and the rear surface BS of the semiconductor chip 100 (the example embodiments in FIGS. 7 and 9).

In an example embodiment, an alignment structure AS (also described as an alignment pattern) used as an alignment key or alignment mark between the semiconductor chips 100 stacked in a vertical direction (Z-axis direction) in a direct bonding process for the semiconductor chip 100 may be formed in a plurality of layers, and marks AMa (hereinafter, "external marks" or "outermost marks") directly providing a bonding surface may be configured to have a size similar to that of a pad (hereinafter, "external pad") of a signal or a power pad structure PS, such that dishing and erosion occurring in the external marks AMa may be controlled in the planarization process for the bonding layer BL. Accordingly, flatness of the bonding surface provided by the bonding layer BL, that is, for example, flatness of the front surface FS in FIG. 1A may improve, and reliability of the bonding surface may be secured during direct bonding. Also, marks AMb not directly providing a bonding surface (hereinafter, "internal marks," or also described as "inner marks" or "below-surface marks") may be disposed to overlap a spacing between the external marks AMa in the vertical direction (Z-axis direction), such that the internal marks AMb may provide a planar area securing visibility of the alignment structure AS by being combined with the external marks AMa.

As illustrated in FIG. 1A, the alignment structure AS may be electrically insulated from the pad structure PS, and may include the external marks AMa providing the front surface FS and the internal marks AMb interlaced with the external marks AMa on the external marks AMa. Thus, the alignment structure, including the external marks AMa and internal marks AMb, may be electrically isolated from any active circuit components of the semiconductor chip 100. When viewed from a plan view, the internal marks AMb may be disposed such that central axes thereof may be interlaced with those of the external marks AMa, and the internal marks AMb may be disposed between the external marks AMa spaced apart from each other. The external marks AMa may have a width, in a horizontal direction parallel to a surface of the substrate 110, the same as or similar to that of the external pads Pa providing the front surface FS. Accordingly, after the planarization process for the front surface FS, dishing and erosion of the external marks AMa may be controlled to be a level similar to those of the external pads Pa. Also, the interlaced external marks AMa and internal marks AMb may be used as overlay measurement marks.

For example, as illustrated in FIG. 1B, the external marks AMa and the internal marks AMb may form a group, and may have a predetermined shape when projected onto a plane parallel to the front surface FS of the semiconductor chip 100. For example, since the alignment structure AS in the example embodiment may have a planar shape in which the external marks AMa and the internal marks AMb are projected onto a plane parallel to the front surface FS, the alignment structure AS may have a planar area larger than a planar area of the pad structure PS or the external pad Pa on the same plane. For example the area occupied by outer boundaries of the alignment structure AS in a plane formed by the X-axis and Y-axis may be greater than an area occupied by outer boundaries of the pad structure PS in the plane formed by the X-axis and Y-axis. Accordingly, the alignment structure AS may have a planar area ensuring sufficient visibility in a process of detecting reflected light or diffracted light by the external marks AMa and the internal marks AMb. For example, the planar shape of the alignment structure AS projected onto the X-Y plane may have a maximum diameter of about 10 μm or more. In FIG. 1B, the alignment structure AS may be disposed on a periphery of the semiconductor chip 100, that is, for example, in a scribe region, but an example embodiment thereof is not limited thereto.

Hereinafter, each component included in the semiconductor chip 100 according to an example embodiment will be described in greater detail with reference to FIG. 2.

The substrate 110 may have a first surface S1 and a second surface S2 opposite to each other, and may be implemented as a semiconductor wafer including a semiconductor element such as silicon, and/or a compound semiconductor such as silicon carbide (SiC), gallium arsenide (GaAs), indium arsenide (InAs), and indium phosphide (InP). The substrate 110 may have an active surface (e.g., a first surface S1) having an active region doped with impurities and an inactive surface (e.g., a second surface S2) opposite to the active surface. In FIG. 1A, the second surface S2 of the substrate 110 may provide the rear surface BS of the semiconductor chip 100, but a protective layer (not illustrated) providing the rear surface BS of the semiconductor chip 100 may be formed on the second surface S2 of the substrate 110. The protective layer (not illustrated) may be formed of an insulating material such as silicon oxide, silicon nitride, or silicon oxynitride, but may be formed of an insulating polymer in example embodiments.

The circuit layer 120 may be disposed on the first surface S1 of the substrate 110 and may include an interlayer insulating layer 121 and a wiring structure 125. The interlayer insulating layer 121 may include or be formed of flowable oxide (FOX), tonen silazen (TOSZ), undoped silica glass (USG), borosilica glass (BSG), phosphosilaca glass (PSG), borophosphosilica glass (BPSG), plasma enhanced tetra ethyl ortho silicate (PETEOS), fluoride silicate glass (FSG), high density plasma (HDP) oxide, plasma enhanced oxide (PEOX), flowable CVD (FCVD) oxide, or a combination thereof. At least a portion of the interlayer insulating layer 121 surrounding the wiring structure 125 may be configured as a low-k layer. The interlayer insulating layer 121 may be formed using a chemical vapor deposition (CVD) process, a flowable-CVD process, or a spin coating process. The wiring structure 125 may be configured as a multilayer structure including a wiring pattern and a via formed of, for example, aluminum (Al), gold (Au), cobalt (Co), copper (Cu), nickel (Ni), lead (Pb), tantalum (Ta), tellurium (Te), titanium (Ti), tungsten (W), or a combination thereof. A barrier layer (not illustrated) including titanium (Ti), titanium nitride (TiN), tantalum (Ta), or tantalum nitride (TaN) may be disposed between the wiring pattern and/or via and the interlayer insulating layer 121. Individual devices 115 included in the integrated circuit may be disposed on the first surface S1 of the substrate 110. In this case, the wiring structure 125 may be electrically connected to the individual elements 115 by the wiring portion 113 (e.g., a contact plug). The individual devices, 115, also described as individual elements, may be or passive or active components that include transistors, capacitors, etc. (e.g., FETs such as a planar FET or a FinFET). A set of individual devices 115 may be combined to form, for example, a flash memory, memory devices such as DRAM, SRAM, EEPROM, PRAM, MRAM, FeRAM, or RRAM, logic devices such as AND, OR, or NOT, and various other devices such as LSI, CIS, and MEMS.

The bonding layer BL may be disposed on the substrate 110 and may include a pad structure PS, an alignment structure AS, and an insulating material layer IL surrounding the pad structure PS and the alignment structure AS. For example, the bonding layer BL may be the front bonding layer 130 disposed on the first surface S1 (or active surface) of the substrate 110 or the circuit layer 120. The front bonding layer 130 may include a front pad structure 133 electrically connected to the wiring structure 125, a front alignment structure 135 electrically insulated from the front pad structure 133, and a front insulating material layer 131 surrounding the front pad structure 133 and the front alignment structure 135. The front insulating material layer 131, the front pad structure 133, and the front alignment structure 135 may provide a flat front surface FS or a flat lower surface of the semiconductor chip 100.

Hereinafter, for ease of description, "front bonding layer 130," "front pad structure 133," "front alignment structure 135," and "front insulating material layer 131" may be referred to as "bonding layer BL," "pad structure PS," "alignment structure AS," and "insulating material layer IL," respectively, within a range in which the elements are not confused with the bonding layer BL1 or 150 (see FIGS. 7 and 9) disposed on the rear surface BS of the chip 100. Also, the front pad structure 133, the front alignment structure 135, and the front insulating material layer 131 may also be the same as the pad structure PS, the alignment structure AS, and the insulating material layer IL, respectively, corresponding thereto.

The insulating material layer IL may include an outermost insulating layer ILa providing a front surface FS, and one or more internal insulating layers ILb stacked between the outermost insulating layer ILa and the circuit layer 120. For example, the front insulating material layer 131 may include a front outermost insulating layer 131a and a front internal insulating layer 131b. The insulating material layer IL may include or be formed of, for example, silicon oxide (SiO) or silicon carbonitride (SiCN). In example embodiments, the outermost insulating layer ILa and the internal insulating layer ILb may include or be formed of different types of materials. For example, the outermost insulating layer ILa may include or be formed of silicon carbonitride (SiCN), and the internal insulating layer ILb may include or be formed of silicon oxide (SiO). The outermost insulating layer ILa may provide a bonding surface for bonding and coupling to an external device (e.g., a semiconductor chip, a semiconductor substrate, or the like).

The pad structure PS may include an external pad Pa disposed in the outermost insulating layer ILa, and one or more internal pads Pb disposed in the one or more internal insulating layers ILb. For example, the front pad structure 133 may include a front external pad 133a and a front internal pad 133b. The pad structure PS may be electrically connected to the wiring structure 125 of the circuit layer 120 and may receive power or a signal from an external device or may transmit a signal of the circuit layer 120 to an external entity. The planarization process for the front surface FS may be performed in consideration of a width d3 of the external pad Pa so as to control dishing of the external pad Pa. The pad structure PS may include or be formed of, for example, one of copper (Cu), nickel (Ni), gold (Au), silver (Ag), or alloys thereof.

The alignment structure AS may include external portions, such as external marks AMa disposed in the outermost insulating layer ILa and spaced apart from each other in a first direction (X-axis direction) parallel to the front surface FS when viewed from the Y-axis direction, and internal portions, such as internal marks AMb disposed within the one or more internal insulating layers ILb in one or more layers and interlaced (e.g., in an alternating, staggered manner) with the external marks AMa when viewed in a second direction (Z-axis direction) perpendicular to the front surface FS. In an example, the front alignment structure 135 may include front external marks 135a and front internal marks 135b. The alignment structure AS may include or be formed of, for example, one of copper (Cu), nickel (Ni), gold (Au), silver (Ag), or alloys thereof.

The external marks AMa may have a width d1 substantially the same as a width d3 of the external pad Pa of the pad structure PS in the first direction (X-axis direction). The width d1 refers to a width of an individual component of the external marks AMa, for example along the line I-I' shown in FIG. 1A (e.g., the central component, or one of the four sides of the shape formed by the outer portion). For example, a difference between the width d1 of the external marks AMa and the width d3 of the external pad Pa may be about 20% or less, or about 10% or less. When the width d3 of the external pad Pa is about 2 the width d1 of the external marks AMa may be in the range of about 1.6 μm to about 2.4 or in the range of about 1.8 μm to about 2.2 Accordingly, after the planarization process for the front surface FS, dishing similar to that of the external pad Pa may be formed on the external marks AMa (e.g., having a radius of curvature within 10% or 20% of the radius of curvature of the dishing of the external pad Pa). Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The external marks AMa may include portions that are spaced apart from each other in a first direction (X-axis direction), for example, and a spacing between these portions of the external marks AMa may be filled by the outermost insulating layer ILa. Throughout this specification, each portion of the external marks AMa, when shown in cross-sectional view, may be simply referred to as an external mark AMa. The same applies for internal marks AMb. However, an entirety of the external marks that form a particular external alignment pattern (e.g., the three marks AMa shown in FIG. 2) may be described as an external alignment pattern. Again, the same applies for internal marks. The width sd of the spacing between the external marks AM, for example, the width sd between portions of the external marks AMa, may be similar to the width d1 of the external marks AMa (e.g., within 10% or 20%). However, an example embodiment thereof is not limited thereto, and the width sd between the external marks AMa may be configured as a spacing which may prevent erosion of the region in which the external marks AMa are densely disposed in the planarization process for the front surface FS. According to an embodiment, the width sd between portions of each external mark AMa may be equal to, greater than, or less than the width d1 of the portions of the external marks AMa.

The internal marks AMb may be disposed to overlap a spacing between the external marks AMa when viewed from a vertical direction (Z-axis direction). As an example, the internal marks AMb may have a width d2 the same as or greater than the width sd (or spacing distance) between the external marks AMa such that the internal insulating layer ILb may not be disposed in the spacing between the external marks AMa, when viewed from the vertical direction. Accordingly, the external marks AMa and the internal marks AMb may form a group and may together, when viewed from a vertical direction (Z-axis direction) and projected onto a plane extending in the X-axis and Y-axis direction, form a planar shape of the alignment structure AS, and may have a planar area larger than a planar area of the pad structure PS or the external pad Pa.

Hereinafter, a planar shape of the alignment structure AS will be described with reference to FIG. 3. FIG. 3 illustrates a planar shape of the alignment structure AS projected onto a plane (e.g., X-Y plane) parallel to the front surface FS in FIG. 1A.

As illustrated in FIG. 3, the alignment structure AS may have various planar shapes, shown as (a), (b), and (c). For example, on the X-Y plane, the external marks AMa may form a first pattern PT1 and a second pattern PT2 spaced apart from the first pattern PT1 and continuously surrounding the first pattern PT1, and the internal marks AMb may form a third pattern PT3 continuously extending between the first pattern PT1 and the second pattern PT2. In this case, the line width of each of the first pattern PT1 and the second pattern PT2 may be substantially the same as the width d1 of the external marks AMa, and the line width of the third pattern PT3 may be substantially the same as the width d2 of the internal marks AMb. Each pattern may be circular, such as shown in (a), or may be rectangular or square, such as shown in (b), or may have a cross or plus-sign shape (+), such as shown in (c). The planar shape formed by the first pattern PT1, the second pattern PT2, and the third pattern PT3 may have a planar area ensuring sufficient visibility in the process of detecting the alignment structure AS. For example, on the X-Y plane, a maximum diameter D as shown in (a), or a maximum width D in the X-axis or Y-axis direction as shown in (b) and (c), of the alignment structure AS including the first pattern PT1, the second pattern PT2, and the third pattern PT3 may be about 10 μm or more. Terms such as "same," "equal," "flat," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements indicate otherwise.

Figure 4:
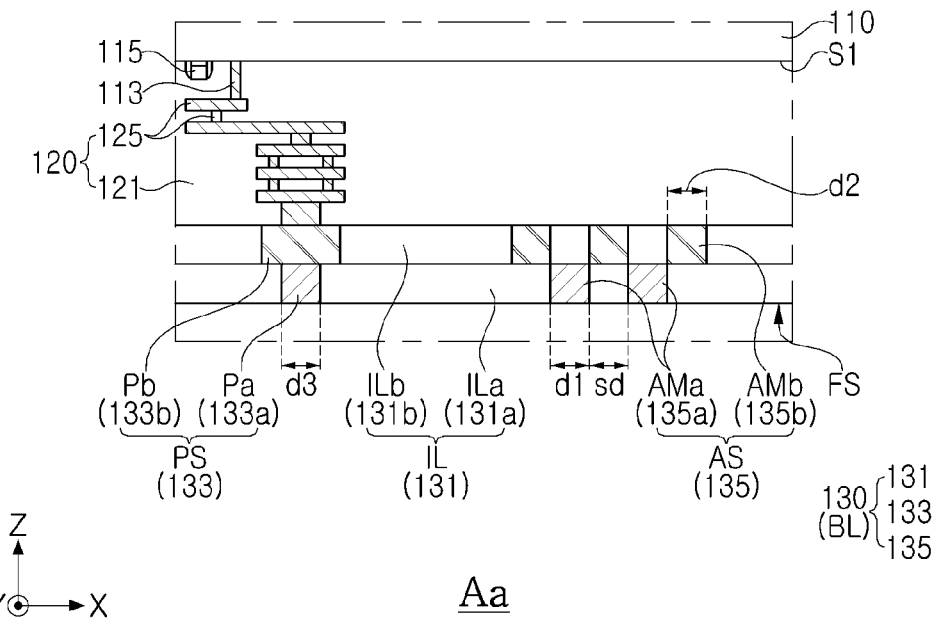
FIG. 4 is an enlarged diagram illustrating a modified example of a portion of a semiconductor chip according to an example embodiment of the present disclosure.

FIG. 4 is an enlarged diagram illustrating a modified example of a portion of a semiconductor chip, illustrating region "Aa" corresponding to region "A" in FIG. 2 in a semiconductor chip 100a of a modified example.

Referring to FIG. 4, the semiconductor chip 100a according to the modified example may be configured the same as or similarly to the aforementioned example embodiment described with reference to FIGS. 1A to 3, other than the configuration in which the planar area of (e.g., area occupied by and/or area occupied between outer boundaries of) the external marks AMa exposed on the front surface FS may be smaller than the planar area of (e.g., area occupied by and/or area occupied between outer boundaries of) the internal marks AMb embedded in the internal insulating layer ILb. The alignment structure AS illustrated in FIGS. 2 and 3 may be configured such that the planar area of the surfaces (e.g., lower surfaces) of the external marks AMa directed to the front surface FS may be larger than the planar area of the surfaces (e.g., lower surfaces) of the internal marks AMb directed in the same direction as above, whereas the alignment structure AS of this modification shown in FIG. 4 may be configured such that the planar area of the surfaces (e.g., lower surfaces) of the external marks AMa directed to the front surface FS may be smaller than the planar area of the surfaces (e.g., lower surfaces) of the internal marks AMb. For example, the front alignment structure 135 may be configured such that the planar area of the surfaces (e.g., lower surfaces) of the front external marks 135a directed to the front surface FS may be smaller than the planar area of the surfaces (e.g., lower surfaces) of the front internal marks 135b. In this case, the area of the external marks AMa affected by the planarization process for the front surface FS may be reduced, and the width sd between the external marks AMa within the area of the alignment structure AS may be increased, such that erosion due to the planarization process may be reduced.

Figure 5:
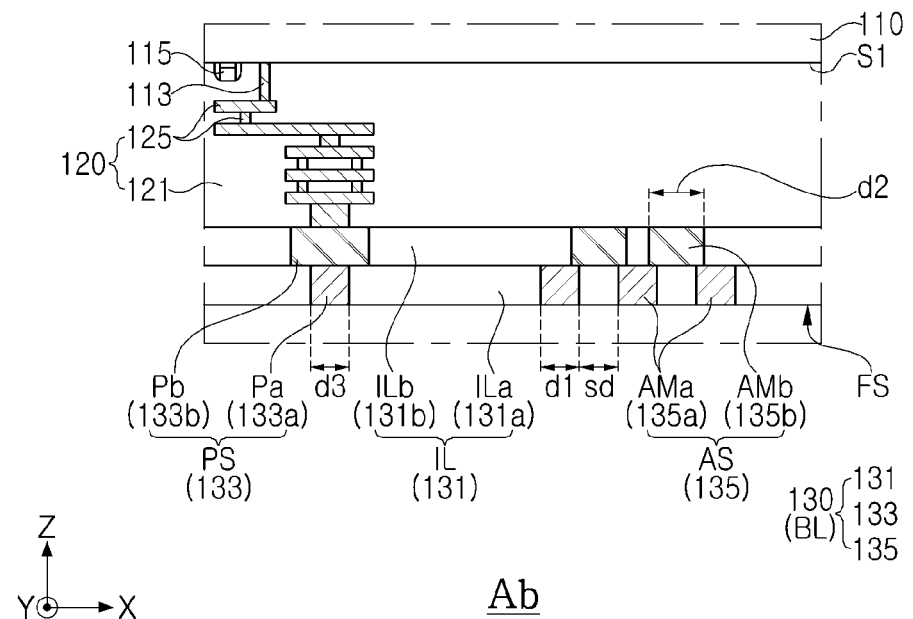
FIG. 5 is an enlarged diagram illustrating a modified example of a portion of a semiconductor chip according to an example embodiment of the present disclosure.

FIG. 5 is an enlarged diagram illustrating a modified example of a portion of a semiconductor chip, illustrating region "Ab" corresponding to region "A" in FIG. 2 in a semiconductor chip 100b of a modified example.

Referring to FIG. 5, the semiconductor chip 100b according to the modified example may be configured the same as or similarly to the aforementioned example embodiment described with reference to FIGS. 1A to 4, other than the configuration in which the width d2 of the internal marks AMb may be greater than the width sd between the external marks AMa. The internal marks AMb in this modified example may be configured to have a width d2 greater than the width sd between the external marks AMa in consideration of an alignment error with the external marks AMa. For example, the front internal marks 135b may be configured to have the width d2 greater than the width sd between the front external marks 135a. The front internal marks 135b may overlap in part with the front external marks 135a from a plan view. In this case, the process margin of the alignment structure AS may increase, and a planar area for securing visibility of the alignment structure AS may be easily secured.

Figure 6:
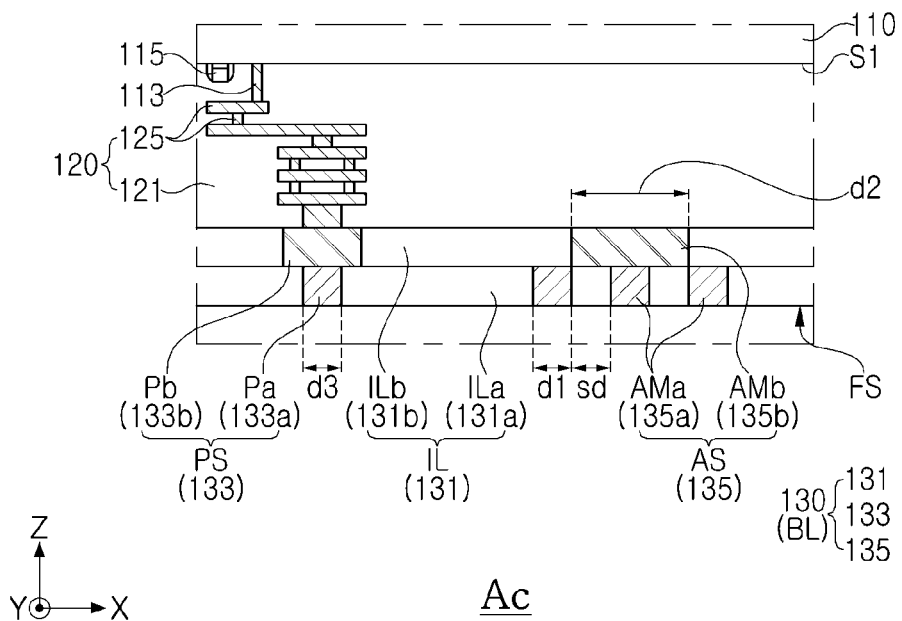
FIG. 6 is an enlarged diagram illustrating a modified example of a portion of a semiconductor chip according to an example embodiment of the present disclosure.

FIG. 6 is an enlarged diagram illustrating a modified example of a portion of a semiconductor chip, illustrating region "Ac" corresponding to region "A" in FIG. 2 in a semiconductor chip 100c of a modified example.

Referring to FIG. 6, the semiconductor chip 100c according to the modified example may be configured the same as or similarly to the aforementioned example embodiment described with reference to FIGS. 1A to 4, other than the configuration in which the internal mark AMb may be configured to have a shape to cover the spacing between the external marks AMa and at least a portion of the external marks AMa. The internal mark AMb in the modified example may have a planar area or a width d2 covering both the spacing between the external marks AMa and the external mark AMa disposed in a central portion. For example, the front internal mark 135b may have a width d2 covering the spacing between the front external marks AMa and the front external mark AMa in a central portion. In this case, the process margin of the alignment structure AS may increase, and a planar area for securing visibility of the alignment structure AS may be easily secured.

Figure 7:
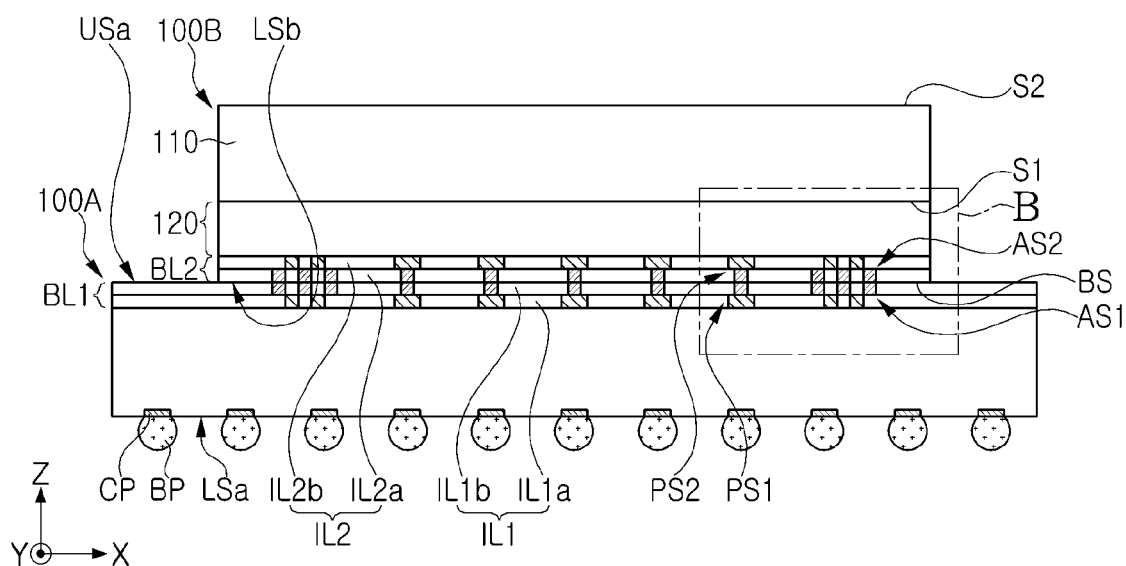
FIG. 7 is a cross-sectional diagram illustrating a semiconductor package according to an example embodiment of the present disclosure.
Figure 8A:
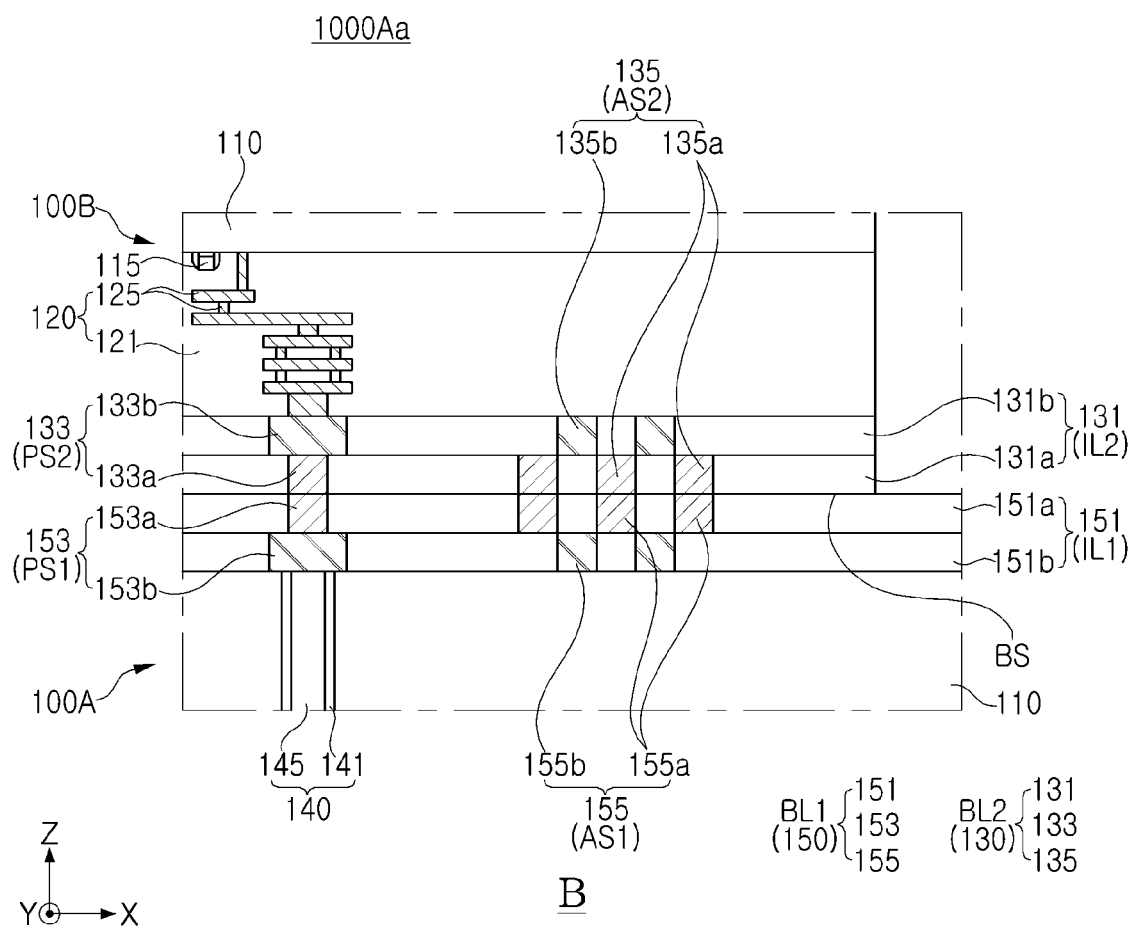
FIGS. 8A and 8B are enlarged diagrams illustrating a modified example of the semiconductor package illustrated in FIG. 7.
Figure 8B:
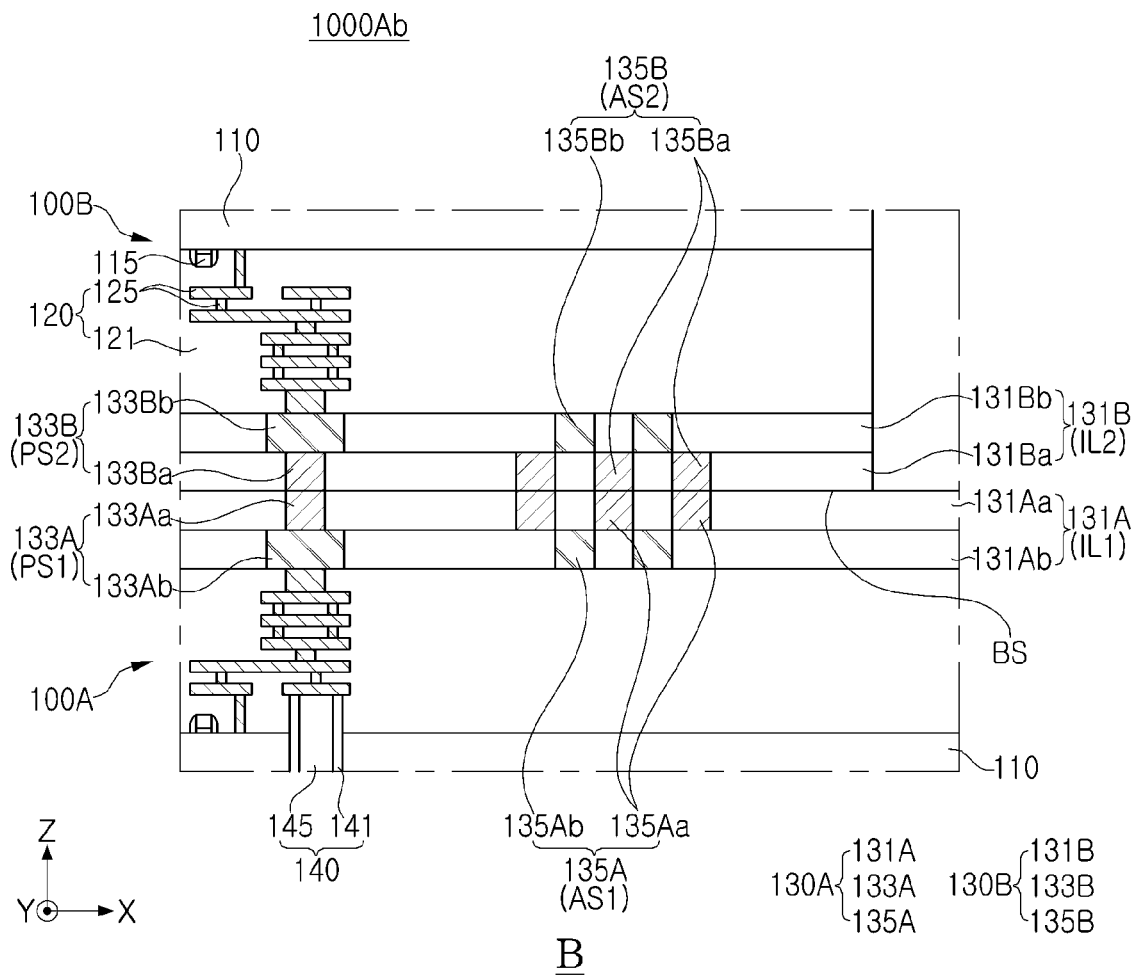

FIG. 7 is a cross-sectional diagram illustrating a semiconductor package 1000A according to an example embodiment. FIGS. 8A and 8B are enlarged diagrams illustrating a modified example of the semiconductor package illustrated in FIG. 7, illustrating regions corresponding to region "B" in FIG. 7 in semiconductor chips 1000Aa and 1000Ab in the modified example, respectively.

Referring to FIG. 7, a semiconductor package 1000A according to an example embodiment may include a first semiconductor chip 100A and a second semiconductor chip 100B stacked in a vertical direction (Z-axis direction). In the example embodiment, in the first semiconductor chip 100A and the second semiconductor chip 100B, the first bonding layer BL1 providing the flat upper surface USa of the first semiconductor chip 100 and the second bonding layer BL2 providing the flat lower surface LSb of the second semiconductor chip 100B may form a bonding surface BS on which the first bonding layer BL1 and the second bonding layer BL2 are directly bonded and coupled to each other.

Here, the first bonding layer BL1 may include a first insulating material layer ILL a first pad structure PS1, and a first alignment structure AS1, and the second bonding layer BL2 may include a second insulating material layer IL2, a second pad structure PS2, and a second alignment structure AS2. The first bonding layer BL1 and the second bonding layer BL2 may be configured the same as or similar to the bonding layer BL described with reference to FIGS. 1A to 6, and are denoted by reference numerals similar to those of the components of the bonding layer BL.

The first semiconductor chip 100A and the second semiconductor chip 100B may include components the same as or similar to those of the semiconductor chip 100 described with reference to FIGS. 1A to 2, and thus, overlapping descriptions and reference numerals are not provided. A connection pad CP and a bump structure BP may be disposed on the lower surface LSa of the first semiconductor chip 100A. The connection pad CP may be electrically connected to an integrated circuit disposed in the first semiconductor chip 100A, and the bump structure BP may electrically connect an external device to the connection pad CP. The bump structure BP may include or may be, for example, a solder ball, or may have a structure in which a metal pillar and a solder ball are combined in example embodiments. In example embodiments, a lower bonding layer for direct bonding may be formed on the lower surface LSa of the first semiconductor chip 100A, similarly to the second bonding layer BL2. It should be noted that the components described herein in the singular but shown in the figures in plural may be provided in plural, with each component of the plurality of components having a structure such as described herein in connection with single components.

The first semiconductor chip 100A and the second semiconductor chip 100B may be configured as chiplets (e.g., stacked chips) included in a multi-chip module (MCM). In this case, the number of the second semiconductor chips 100B stacked vertically or horizontally on the first semiconductor chip 100A may be two or more. For example, the second semiconductor chip 100B on the first semiconductor chip 100A may include I/O, CPU, GPU, a field programmable gate array (FPGA) chip, or the like, and the first semiconductor chip 100A may be configured as an active interposer performing a function of an I/O chip, and in this case, the first semiconductor chip 100A may include an I/O device, a DC/DC converter, a sensor, a test circuit, and the like, therein. In example embodiments, the first semiconductor chip 100A may be implemented as a logic chip including a central processor (CPU), a graphics processor (GPU), a field programmable gate array (FPGA), an application processor (AP), a digital signal processor (DSP), a cryptographic processor, a microprocessor, a microcontroller, an analog-to-digital converter, an application specific semiconductor (ASIC), and the like, and the second semiconductor chip 100B may be implemented as a memory such as DRAM, SRAM, PRAM, MRAM, FeRAM or RRAM. The semiconductor package 1000A may include the above-described chips, which may in some embodiments may be mounted on a package substrate, and additionally may include an encapsulant covering top and/or outer surfaces of the chips.

Referring to FIG. 8A together with FIGS. 6 and 7, the semiconductor package 1000Aa of a modified example may include a first semiconductor chip 100A including a rear bonding layer 150 disposed on a first substrate 110 (disposed in a lower portion) and having a flat upper surface USa provided by the rear bonding layer 150, and a second semiconductor chip 100B disposed on the upper surface USa of the first semiconductor chip 100A, including a front bonding layer 130 disposed below the second substrate 110 (disposed in an upper portion), and having a flat lower surface LSb provided by the front bonding layer 130 and in contact with the upper surface USa of the first semiconductor chip 100A. The rear bonding layer 150 may correspond to the first bonding layer BL1, and the front bonding layer 130 may correspond to the second bonding layer BL2.

The rear bonding layer 150 (or the first bonding layer) may include a rear insulating material layer 151, a rear pad structure 153, and a rear alignment structure 155. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The rear insulating material layer 151 may include an outermost rear insulating layer 151a (or the first outermost insulating layer) providing the upper surface USa of the first semiconductor chip 100A, and one or more rear internal insulating layers 151b (or the first internal insulating layers) stacked below the outermost rear insulating layer 151a. The rear insulating material layer 151 may include or be formed of a material bonding to the front insulating material layer 131 of the second semiconductor chip 100B, such as, for example, silicon oxide (SiO) or silicon carbonitride (SiCN). In example embodiments, the outermost rear insulating layer 151a and the rear internal insulating layer 151b may include or may be formed of different types of materials. For example, the outermost rear insulating layer 151a may include silicon carbonitride (SiCN), and the rear internal insulating layer 151b may include silicon oxide (SiO). The outermost rear insulating layer 151a may provide a bonding surface BS for bonding and coupling to the second semiconductor chip 100B.

The rear pad structure 153 may include a rear external pad 153a (or a first external pad) disposed within the outermost rear insulating layer 151a, and one or more rear internal pads 153b (or first internal pads) disposed in one or more layers disposed in the rear internal insulating layer 151b disposed in one or more layers. The rear external pad 153a may be exposed on the upper surface USa of the first semiconductor chip 100A, and may be bonded and coupled to the front external pad (or the second external pad) 133a of the second semiconductor chip 100B. The rear external pad 153a may include or be formed of a material bonded to the front external pad 133a (or the second external pad), such as, for example, one of copper (Cu), nickel (Ni), gold (Au), silver (Ag) or alloys thereof. The rear pad structure 153 may be electrically connected to a wiring structure (not illustrated) of the first semiconductor chip 100A via the via electrode 140. The via electrode 140 may include a via plug 145 and a side insulating layer 141 surrounding the side surfaces of the via plug 145. The side insulating layer 141 may electrically isolate the via plug 145 from the second substrate 110. The via plug 145 may include or be formed of, for example, tungsten (W), titanium (Ti), aluminum (Al), or copper (Cu), and may be formed by a plating process, a PVD process, or a CVD process. The side insulating layer 141 may include or be formed of a metal compound such as tungsten nitride (WN), titanium nitride (TiN), or tantalum nitride (TaN), and may be formed by a PVD process or a CVD process.

The rear alignment structure 155 may include rear external marks (or the first external marks) 155a disposed in the outermost rear insulating layer 151a and spaced apart from each other, and rear internal marks 155b (or the first internal marks) interlaced with the rear external marks 155a in the rear internal insulating layer 151b. The rear external marks 155a may have a width substantially the same as the width of the rear external pad 153a in the first direction (X-axis direction). For example, a difference between the width of the rear external pad 153a and the width of the rear external marks 155a may be about 20% or less, or about 10% or less. Accordingly, after the planarization process for the upper surface USa of the first semiconductor chip 100A, dishing similar to that of the rear external pad 153a may be formed on the rear external marks 155a. Also, the rear external marks 155a may be spaced apart from each other in the first direction (X-axis direction), for example, and the spacing between the rear external marks 155a may be filled by the outermost rear insulating layer 151a. The width of the spacing between the rear external marks 155a may reduce erosion of the region in which the rear external marks 155a are densely disposed in the planarization process for the upper surface USa of the first semiconductor chip 100A. The rear external marks 155a may include or be formed of a material bonded to the front external marks 135a (or the second external marks) of the second semiconductor chip 100B, such as, for example, one of copper (Cu), nickel (Ni), gold (Au), and silver (Ag), or alloys thereof.

The rear internal marks 155b may be disposed to overlap a spacing between the rear external marks 155a in a direction (Z-axis direction) perpendicular to the upper surface USa of the first semiconductor chip 100A. For example, the rear internal marks 155b may have a width the same as or greater than a width between (or a spacing) between the rear external marks 155a such that the rear internal insulating layer 151b is not disposed within the spacing between the rear surface external marks 155a. Accordingly, the rear external marks 155a and the rear internal marks 155b may form a group and may form a planar shape, when projected onto a horizontal plane, of the rear surface alignment structure 155, and may have a planar area greater than a planar area of the rear surface pad structure 153 or the rear surface external pad 153a. For example, the upper surface of the rear external marks 155a and the upper surface of the rear internal marks 155b opposing the lower surface LSb of the second semiconductor chip 100B may be combined with each other and may form a rear alignment structure 155 having a predetermined planar shape. In example embodiments, the upper surface of the rear external marks 155a may have a planar area smaller than a planar area of the upper surface of the rear internal marks 155b (see the example embodiment in FIG. 4).

The front bonding layer 130 (or the second bonding layer) may include a front insulating material layer 131, a front pad structure 133, and a front alignment structure 135.

The front insulating material layer 131 may include an outermost front insulating layer 131a (or the second outermost insulating layer) providing a lower surface LSba of the second semiconductor chip 100B, and one or more front internal insulating layers 131b (or the second internal insulating layers) stacked on the outermost front insulating layer 131a. The front insulating material layer 131 may include or may be a material bonded to the rear insulating material layer 151 of the second semiconductor chip 100A, such as, for example, silicon oxide (SiO) or silicon carbonitride (SiCN). The outermost front insulating layer 131a may provide a bonding surface BS for bonding and coupling to the first semiconductor chip 100A.

The front pad structure 133 may include a front external pad (or the second external pad) 133a disposed in the outermost front insulating layer 131a, and one or more front internal pads 133b (or second internal pads) disposed in one or more front internal insulating layers 131b. The front external pad 133a may be formed of a material bonded to the rear external pad 153a, such as, for example, one of copper (Cu), nickel (Ni), gold (Au), and silver (Ag) or alloys thereof.

The front alignment structure 135 may include front external marks 135a (or the second external marks) disposed in the outermost front insulating layer 131a and spaced apart from each other, and front internal marks 135b (or the second internal marks) interlaced with the front external marks 135a in the front internal insulating layer 131b. The front external marks 135a and the front internal marks 135b may be configured the same as or similar to the rear external marks 155a and the rear internal marks 155b of the rear alignment structure 155 described above, and thus, overlapping descriptions will be not provided.

Referring to FIG. 8B, the semiconductor package 1000Ab of the modified example may be configured the same as or similarly to the aforementioned example embodiment described with reference to FIGS. 7 and 8A, other than the configuration in which a first front bonding layer 130A of the first semiconductor chip 100A and a second front bonding layer 130B of the second semiconductor chip 100B may be bonded to each other and provide the bonding surface BS. The first front bonding layer 130A may correspond to the first bonding layer BL1, and the second front bonding layer 130B may correspond to the second bonding layer BL2. The first front bonding layer 130A may include a first front insulating material layer 131A including a first front outermost insulating layer 131Aa and a first front internal insulating layer 131Ab, a first front surface pad structure 133A including a first front external pad 131Aa and a first front internal pad 131Ab, and a first front alignment structure 135A including first front external marks 135Aa and first front internal marks 135Ab, and the second front bonding layer 130B may include a second front insulating material layer 131B including a second front outermost insulating layer 131Ba and a second front internal insulating layer 131Bb, a second front surface pad structure 133B including a second front external pad 131Ba and a second front internal pad 131Bb, and a second front alignment structure 135B including second front external marks 135Ba and second front internal marks 135Bb. Each component of the first front bonding layer 130A and the second front bonding layer 130B may be configured the same as or similar to the aforementioned example embodiment described with reference to FIGS. 7 and 8A, and thus overlapping descriptions will be not provided.

Figure 9:
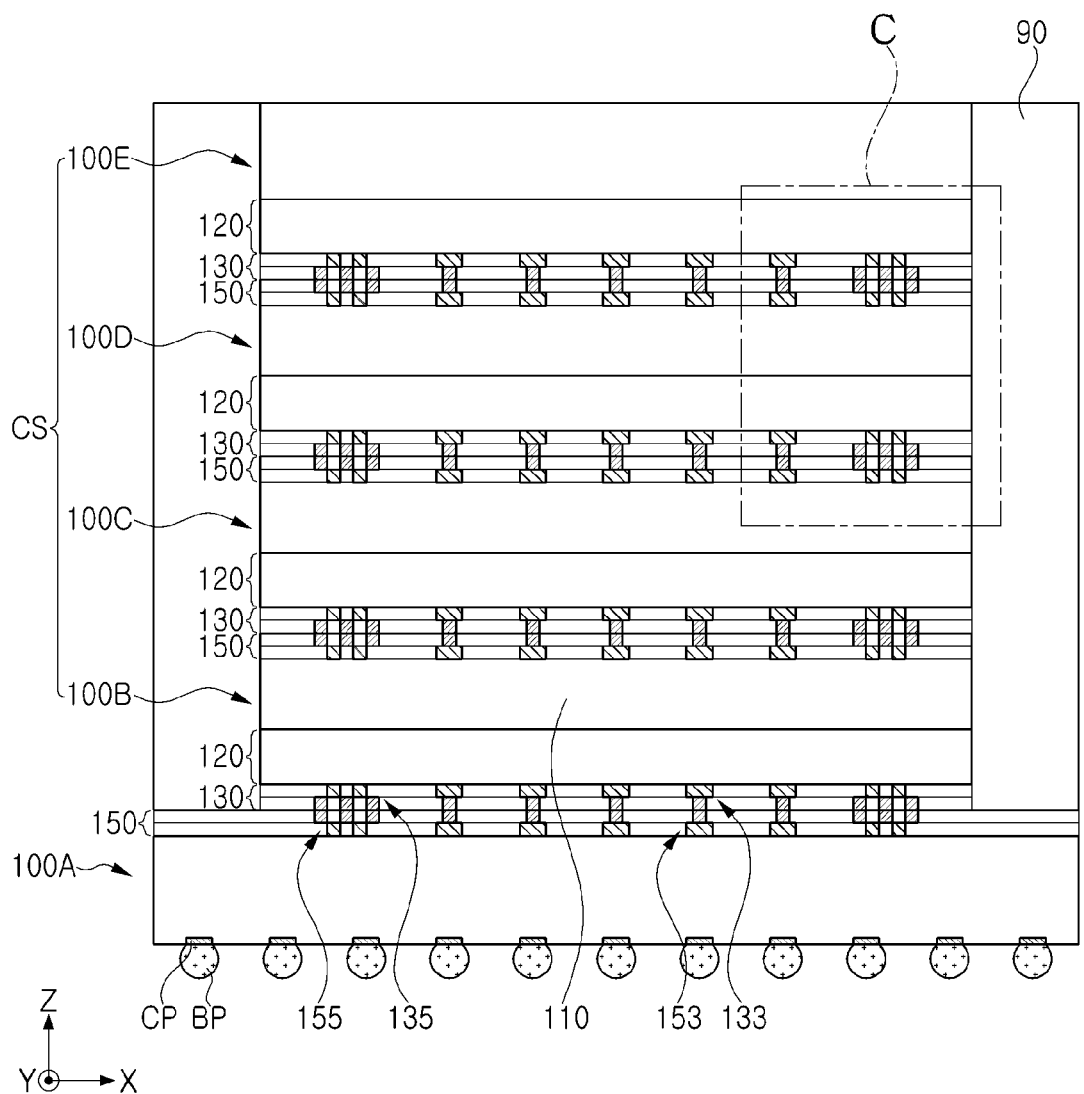
FIG. 9 is a cross-sectional diagram illustrating a semiconductor package according to an example embodiment of the present disclosure.
Figure 10:
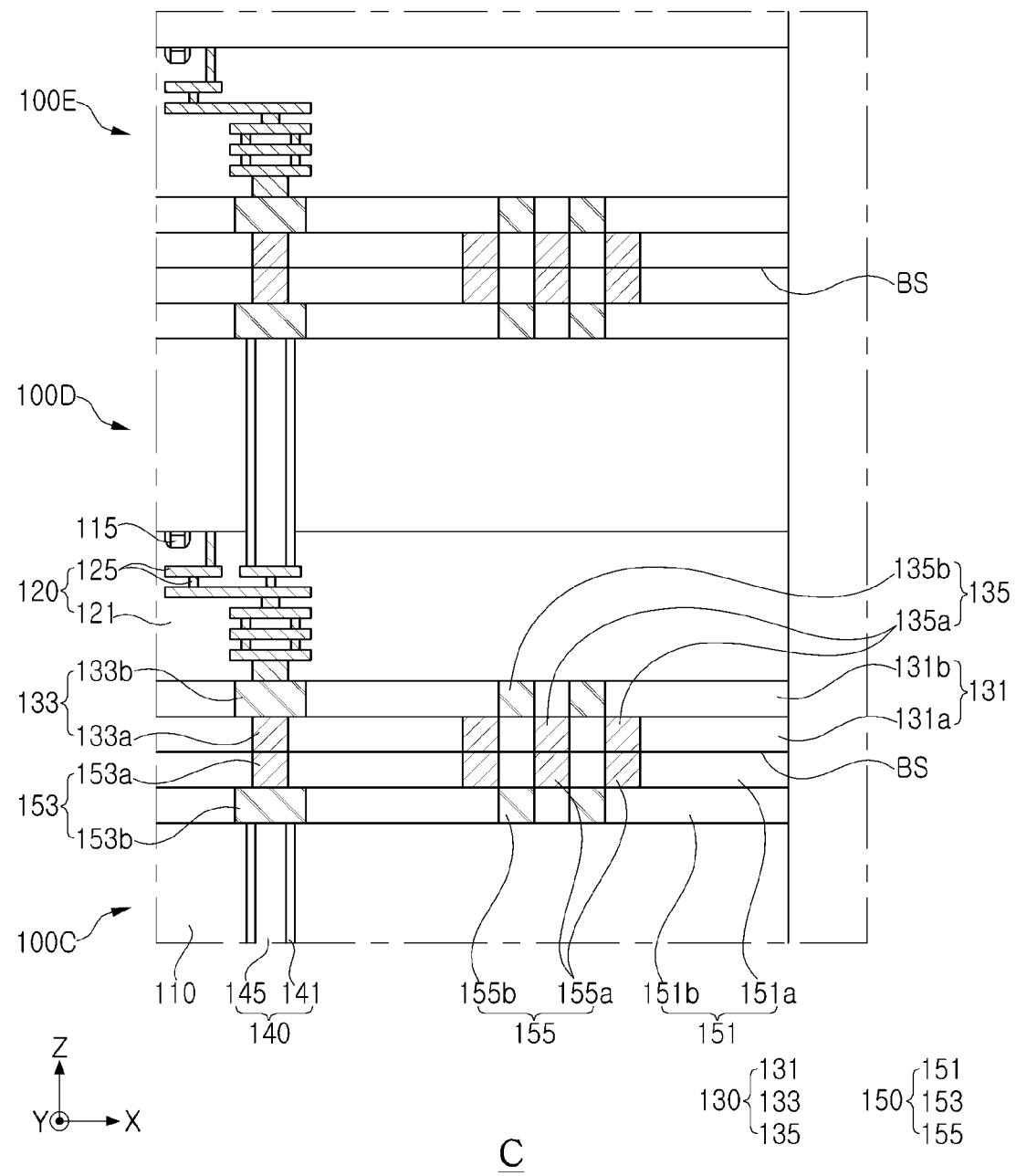
FIG. 10 is an enlarged diagram illustrating region "C" illustrated in FIG. 9.

FIG. 9 is a cross-sectional diagram illustrating a semiconductor package according to an example embodiment. FIG. 10 is an enlarged diagram illustrating region "C" illustrated in FIG. 9.

Referring to FIGS. 9 and 10, the semiconductor package 1000B according to an example embodiment may be configured the same as or similarly to the aforementioned example embodiment described with reference to FIGS. 7 to 8B, other than the configuration in which the semiconductor package 1000B may include a chip structure CS and a molding member 90 disposed on the first semiconductor chip 100A. The chip structure CS may include a plurality of semiconductor chips directly bonded to each other, such as, for example, a second semiconductor chip 100B, a third semiconductor chip 100C, a fourth semiconductor chip 100D, and a fifth semiconductor chip 100E. For example, as illustrated in FIG. 10, a bonding surface BS provided by the rear bonding layer 150 and the front bonding layer 130 may be formed between the third semiconductor chip 100C and the fourth semiconductor chip 100D and between the fourth semiconductor chip 100D and the fifth semiconductor chip 100E. In example embodiments, the number of semiconductor chips included in the chip structure CS may be greater or less than the example illustrated in the drawings. For example, the chip structure CS may include three or less or five or more semiconductor chips.

For example, the first semiconductor chip 100A may be a buffer chip or a control chip including a plurality of logic devices and/or memory devices. The first semiconductor chip 100A may transmit signals from the second to fifth semiconductor chips 100B, 100C, 100D, and 100E stacked thereon to an external entity, and may transmit signals and power from an external entity to the second to fifth semiconductor chips 100B, 100C, 100D, and 100E. The second to fifth semiconductor chips 100B, 100C, 100D, and 100E may be memory chips including volatile memory devices such as DRAM and SRAM or non-volatile memory devices such as PRAM, MRAM, FeRAM, or RRAM. In this case, the semiconductor package 1000B in the example embodiment may be used for a high bandwidth memory (HBM) product, an electro data processing (EDP) product, or the like.

The first to fifth semiconductor chips 100A, 100B, 100C, 100D, and 100E may include components the same as or similar to those of the semiconductor chip 100 illustrated in FIGS. 1A to 2, other than the configuration in which the first to fifth semiconductor chips 100A, 100B, 100C, 100D, and 100E further include a via electrode 140 for forming an electrical connection path therebetween, and thus, reference numerals and descriptions of the same components are not provided. However, the fifth semiconductor chip 100E disposed in an uppermost portion may not include the via electrode 140 and may have a relatively large thickness.

The molding member 90 may be disposed on the first semiconductor chip 100A, and may encapsulate at least a portion of each of the second to fifth semiconductor chips 100B, 100C, 100D, and 100E. The molding member 90 may be formed to expose an upper surface of the fifth semiconductor chip 100E disposed in the uppermost portion. However, in example embodiments, the molding member 90 may be formed to cover the upper surface of the fifth semiconductor chip 100E. The molding member 90 may include or be formed of, for example, epoxy mold compound (EMC), but the material of the molding member 90 is not limited to any particular example.

Figure 11:
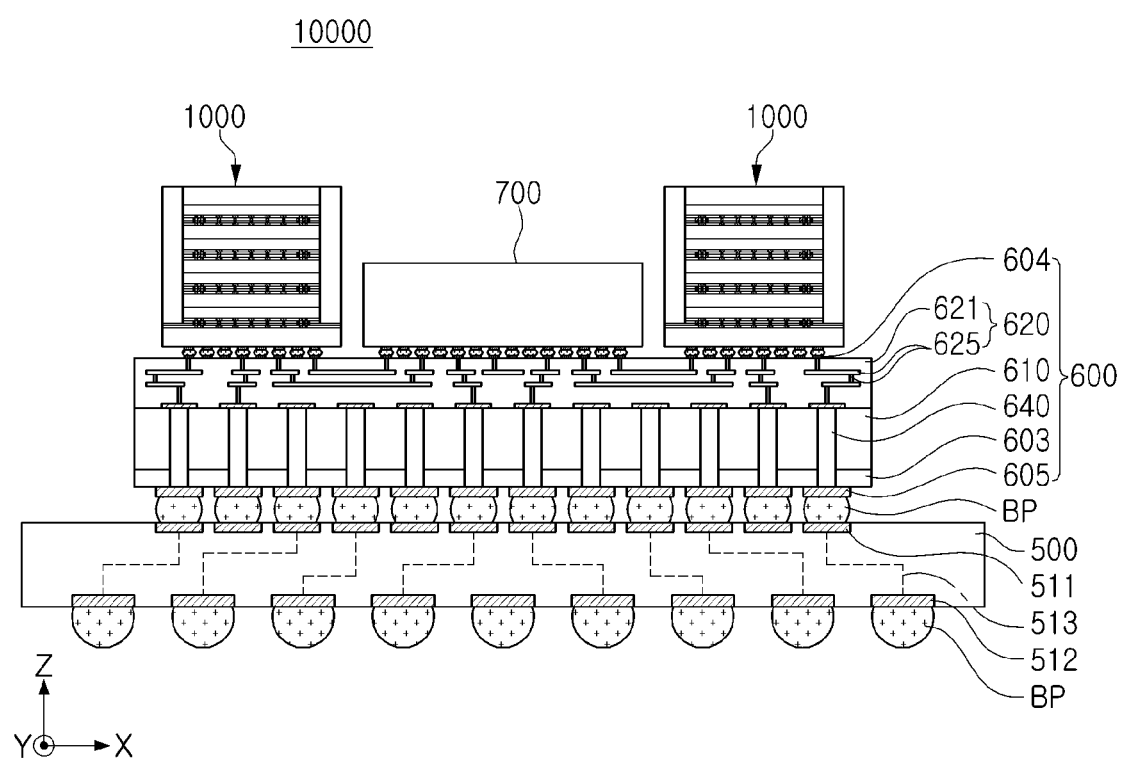
FIG. 11 is a cross-sectional diagram illustrating a semiconductor package according to an example embodiment of the present disclosure.

FIG. 11 is a cross-sectional diagram illustrating a semiconductor package 10000 according to an example embodiment.

Referring to FIG. 11, a semiconductor package 10000 according to an example embodiment may include a package substrate 500, an interposer substrate 600, and at least one package structure 1000. Also, the semiconductor package 10000 may further include a logic chip or a processor chip 700 disposed adjacent to the package structure 1000 on the interposer substrate 600. The package structure 1000 may be configured the same as or similar to the semiconductor package 1000B described with reference to FIGS. 9 and 10.

The package substrate 500 may be a support substrate on which the interposer substrate 600, the logic chip 700, and the package structure 1000 are mounted, and may be a substrate for a semiconductor package including a printed circuit board (PCB), a ceramic substrate, a glass substrate, and a tape wiring substrate, and the like. The body of the package substrate 500 may include different materials depending on the type of the substrate. For example, when the package substrate 500 is a printed circuit board, a wiring layer may be additionally stacked on one surface or both surfaces of a body copper clad laminate or a copper clad laminate.

The interposer substrate 600 may include a substrate 610, an interconnection structure 620, and a through-via 640. The package structure 1000 and the processor chip 700 may be stacked on the package substrate 500 via the interposer substrate 600. The interposer substrate 600 may electrically connect the package structure 1000 to the processor chip 700.

The substrate 610 may be formed of, for example, one of silicon, an organic material, plastic, and a glass substrate. When the substrate 610 is a silicon substrate, the interposer substrate 600 may be referred to as a silicon interposer. When the substrate 610 is an organic substrate, the interposer substrate 600 may be referred to as a panel interposer. A lower protective layer 603 and a lower pad 605 may be disposed on the lower surface of the substrate 610. The lower pad 605 may be connected to the through-via 640. The package structure 1000 and the processor chip 700 may be electrically connected to the package substrate 500 via the bump structure BP disposed on the lower pad 605.

The interconnection structure 620 may be disposed on the upper surface of the substrate 610, and may include an interlayer insulating layer 621 and a single wiring structure 622 or multiple wiring structures 622. When the interconnection structure 620 has a multilayer wiring structure, wiring patterns of different layers may be connected to each other through contact vias. The interposer substrate 600 may be used for converting or transferring an input electrical signal between the package substrate 500 and the package structure 1000 or the processor chip 700. Accordingly, the interconnection structure 620 may not include elements such as active devices or passive devices. Also, in example embodiments, the interconnection structure 620 may be disposed below the through-via 640. For example, the positional relationship between the interconnection structure 620 and the through-via 640 may be relative.

The through-via 640 may extend from the upper surface to the lower surface of the substrate 610 and may penetrate the substrate 610. Also, the through-via 640 may extend into the interconnection structure 620 and may be electrically connected to the wiring structure 622. When the substrate 610 is silicon, the through-via 640 may be referred to as a TSV. In example embodiments, the interposer substrate 600 may include only an interconnection structure therein, and may not include a through-via.

The logic chip or processor chip 700 may include, for example, a central processor (CPU), a graphics processor (GPU), a field programmable gate array (FPGA), a digital signal processor (DSP), a cryptographic processor, a microprocessor, a microcontroller, an analog-to-digital converter, an application specific integrated circuits (ASIC), and the like. Depending on the types of devices included in the rule chip 800, the semiconductor package 10000 may be referred to as a server-oriented semiconductor package or a mobile-oriented semiconductor package.

The semiconductor package 10000 may further include an internal encapsulant covering side surfaces and upper surfaces of the package structure 1000 and the processor chip 700 on the interposer substrate 600. Also, the semiconductor package 10000 may further include an external encapsulant covering the interposer substrate 600 and the internal encapsulant on the package substrate 500. The external encapsulant and the internal encapsulant may be formed together and may not be distinct from each other. In example embodiments, the semiconductor package 10000 may further include a heat dissipation structure covering the package structure 1000 and the processor chip 700 on the package substrate 500.

Figure 12A:
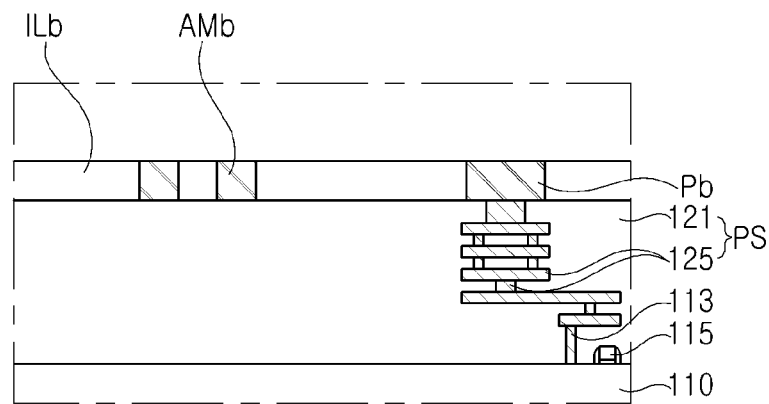
FIGS. 12A to 12C are enlarged diagrams illustrating a portion of processes of manufacturing a semiconductor chip in order according to an example embodiment of the present disclosure.
Figure 12B:
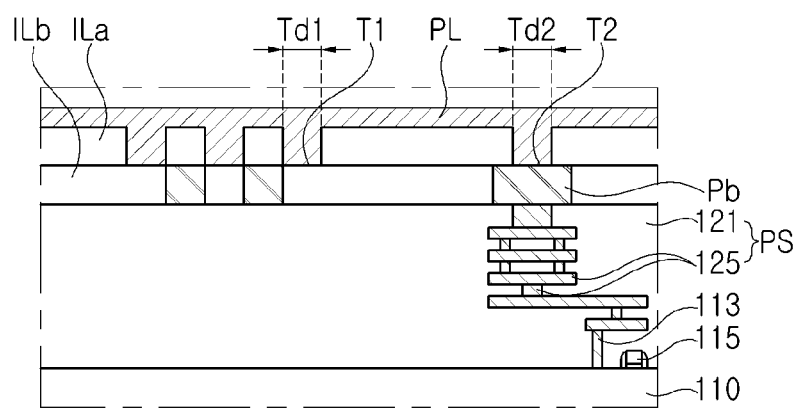
Figure 12C:
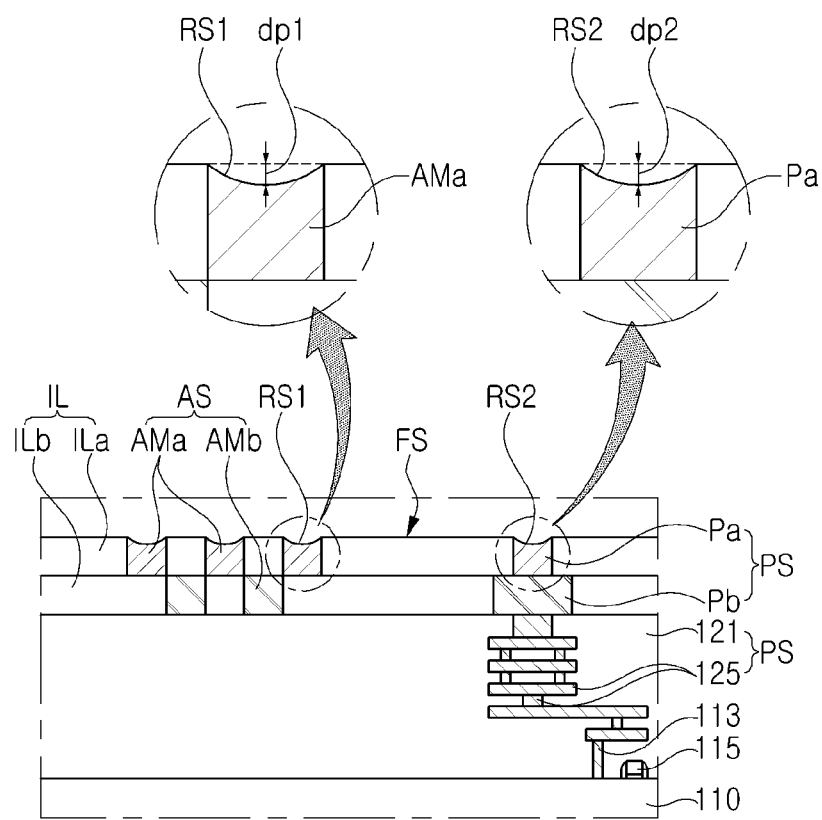
Figure 12D:
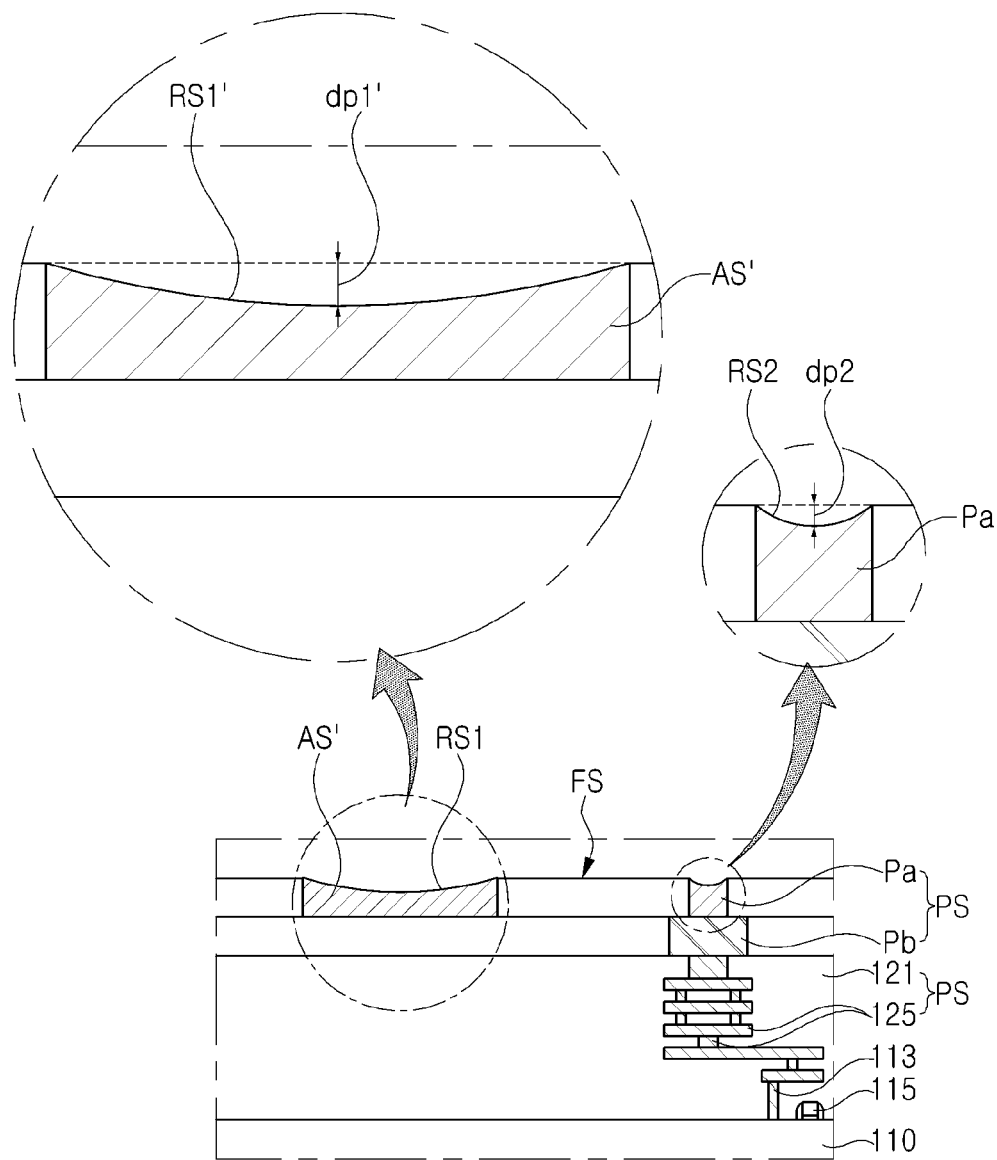
FIG. 12D is an enlarged diagram illustrating dishing occurring on an alignment structure of a comparative example by a planarization process.

FIGS. 12A to 12C are enlarged diagrams illustrating a portion of processes of manufacturing a semiconductor chip in order according to an example embodiment. FIG. 12D is an enlarged diagram illustrating dishing occurring on an alignment structure of a comparative example by a planarization process.

Referring to FIG. 12A, for example, internal insulating layer ILb, internal pad Pb, and internal marks AMb may be formed on the circuit layer 120. The internal insulating layer ILb may include, for example, silicon oxide. The internal insulating layer ILb may be formed using a chemical vapor deposition (CVD) process, a flowable-CVD process, or a spin coating process. The internal pad Pb and the internal marks AMb may be formed by filling an etched region of the internal insulating layer ILb with a metal such as copper (Cu). The etched region of the internal insulating layer ILb may be formed using a photolithography process. The internal pad Pb and the internal marks AMb may be formed by performing a planarization process such as a chemical mechanical polishing (CMP) process after a plating process.

Referring to FIG. 12B, an outermost insulating layer ILa and a plating layer PL may be formed on the internal insulating layer ILb. The outermost insulating layer ILa may include, for example, silicon oxide or silicon carbonitride. The outermost insulating layer ILa may include a first trench T1 and a second trench T2 etched by a photolithography process. The width Td1 of the first trench T1 may be formed to be substantially the same as the width Td2 of the second trench T2. In some embodiments, a difference between the width Td1 of the first trench T1 and the width Td2 of the second trench T2 may be about 20% or less. The plating layer PL may be formed to fill the first trench T1 and the second trench T2 by a plating process. A barrier layer (not illustrated) and a seed layer (not illustrated) may be disposed below the plating layer PL. A barrier layer (not illustrated) and a seed layer (not illustrated) may extend along internal walls of the first trench T1 and the second trench T2. The barrier layer (not illustrated) may include or be formed of, for example, T1/TiN, and the seed layer (not illustrated) may include or be formed of, for example, Cu.

Referring to FIG. 12C, the front surface FS provided by the outermost insulating layer ILa, the external pad Pa, and the external marks AMa may be formed. A barrier layer (not illustrated) and a seed layer (not illustrated) may be disposed on side surfaces and lower surfaces of the external pad Pa and the external marks AMa. The front surface FS may be formed by, for example, performing a CMP process. Due to dishing occurring in the CMP process, the external marks AMa may have a first recessed surface RS1, and the external pad Pa may have a second recessed surface RS2. In an example embodiment, by configuring the width of the external marks AMa to be substantially the same as the width of the external pad Pa, a difference in dishing occurring in the external marks AMa and the external pad Pa after the CMP process may be reduced. For example, the depth dp1 from the front surface FS to the first recess surface RS1 may be substantially the same as the depth dp2 from the front surface FS to the second recess surface RS2. In example embodiments, "substantially the same level" or "substantially the same" may include process errors or expected variations due to manufacturing, and does not indicate that the configurations are exactly physically the same.

Differently from the above example, referring to FIG. 12D, in the alignment structure AS' in the comparative example having a width greater than the width of the external pad Pa, the depth of dishing may be relatively increased after the CMP process. The alignment structure AS' in the comparative example may be a single layer having a width for securing visibility, such as, for example, a width of about 10 μm or more. In this case, after the CMP process, the depth dp1' from the front surface FS to the recess surface RS1' of the comparative example may be configured to be greater than the depth dp2 from the front surface FS to the second recess surface RS2 and this difference may cause voids in the direct bonding process and may decrease process yield.

Figure 14A:
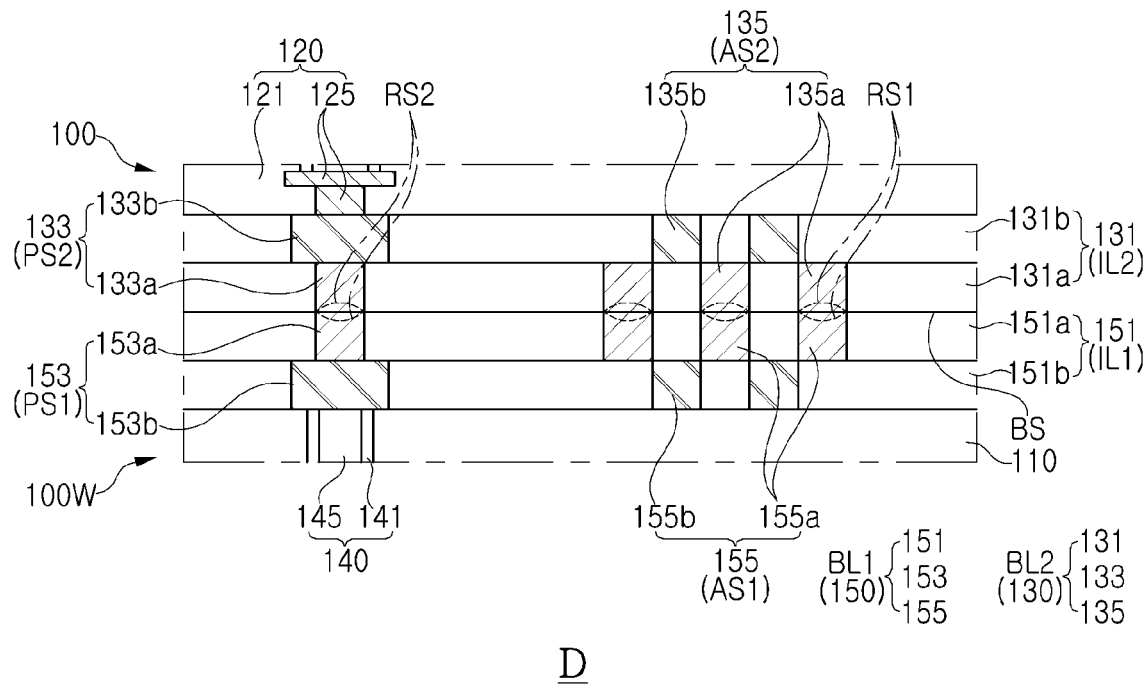
FIG. 14A is an enlarged diagram illustrating region "D" in FIG. 13.
Figure 14B:
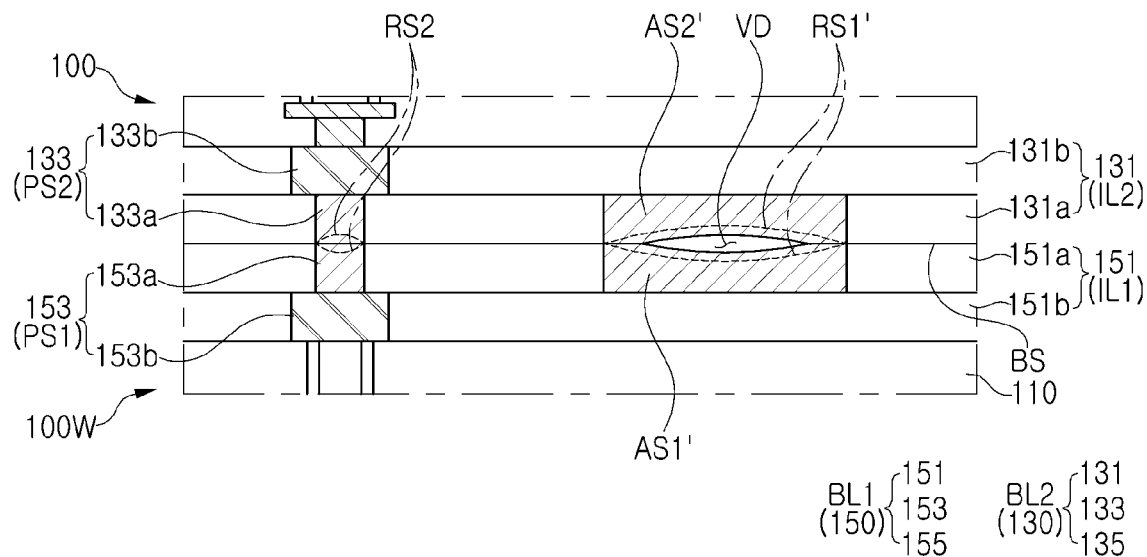
FIG. 14B is an enlarged diagram illustrating voids formed between alignment structures of a comparative example during a process of bonding a semiconductor chip.

FIG. 13 is a cross-sectional diagram illustrating a portion of processes of manufacturing a semiconductor package according to an example embodiment. FIG. 14A is an enlarged diagram illustrating region "D" in FIG. 13. FIG. 14B is an enlarged diagram illustrating voids formed between alignment structures AS1' and AS2' of a comparative example during a process of bonding a semiconductor chip.

Referring to FIG. 13, the semiconductor chip 100 may be disposed on a base wafer 100W. The base wafer 100W may include components for the first semiconductor chip 100A in FIG. 7. The semiconductor chip 100 may be disposed on the base wafer 100W using a pick-and-place device 10. The upper surface of the base wafer 100W provided by the first bonding layer BL1 and the lower surface of the semiconductor chip 100 provided by the second bonding layer BL2 may be bonded to each other. In this case, the first pad structure PS1 and the second pad structure PS2, and the first alignment structure AS1 and the second alignment structure AS2, providing the bonding surface, may be bonded to each other by applying pressure in a temperature atmosphere higher than room temperature, that is, for example, in a thermal atmosphere of 200° C. to about 300° C. The temperature of the thermal atmosphere is not limited to about 200° C. to about 300° C. and may be varied.

Referring to FIG. 14A, the first alignment structure AS1 and the second alignment structure AS2 may have the first recess surfaces RS1 similar to second recess surfaces RS2 of the first pad structure PS1 and the second pad structure PS2, respectively, and accordingly, the bonding surface BS may be formed without voids between the first alignment structure AS1 and the second alignment structure AS2 along with bonding and coupling between the first pad structure PS1 and the second pad structure PS2, to form flat surfaces contacting each other. Accordingly, it may not be necessary to provide an additional thermal atmosphere after bonding and coupling the first pad structure PS1 to the second pad structure PS2, the bonding surface between the first alignment structure AS1 and the second alignment structure AS2 may be formed.

Referring to FIG. 14B, a first alignment structure AS1' and a second alignment structure AS2' in the comparative example may have first recess surfaces RS1' recessed more greatly than second recess surfaces RS2 of the first and second pad structures PS1 and PS2. In this case, even after the first pad structure PS1 and the second pad structure PS2 are completely bonded and coupled to each other, voids VD may remain between the first alignment structure AS1' and the second alignment structure AS2' in the comparative example, and accordingly, reliability of the bonding surface BS may be deteriorated.

According to the aforementioned example embodiments, by including a plurality of alignment marks interlaced with each other, a semiconductor chip in which dishing of an alignment structure is controlled during a planarization process may be provided.

Also, using a semiconductor chip in which dishing of the alignment structure is controlled, a semiconductor package having reduced voids during direct bonding and improved yield may be provided.

While the example embodiments have been illustrated and described above, it will be apparent to those skilled in the art that modifications and variations could be made without departing from the scope of the present invention as defined by the appended claims.

What is claimed is:

1. A semiconductor package, comprising:
a first semiconductor chip including a first substrate and a first bonding layer disposed on the first substrate, and having a flat first outer surface provided by the first bonding layer; and
a second semiconductor chip disposed on the first outer surface of the first semiconductor chip, including a second substrate and a second bonding layer disposed on the second substrate, and having a flat second outer surface provided by the second bonding layer and contacting the first outer surface of the first semiconductor chip,
wherein the first bonding layer includes a first outermost insulating layer providing the first outer surface, a first internal insulating layer stacked between the first outermost insulating layer and the first substrate, first external marks disposed in the first outermost insulating layer, the first external marks including a first pattern that is a first center portion and second pattern that is a first ring portion surrounding the first center portion when viewed from a plan view, the first center portion and first ring portion separated by a first gap, and a first internal marks within the first internal insulating layer, the first internal mark formed between the first center portion and the first ring portion from the plan view, wherein the first external marks and first internal marks together form a first alignment structure, and wherein the second bonding layer includes a second outermost insulating layer providing the second outer surface, a second internal insulating layer stacked between the second outermost insulating layer and the second substrate, second external marks disposed in the second outermost insulating layer, the second external marks including a third pattern that is a second center portion and fourth pattern that is a second ring portion surrounding the second center portion when viewed from a plan view, the second center portion and second ring portion separated by a second gap, and a second internal mark within the second internal insulating layer, the second internal mark formed between the second center portion and the second ring portion when viewed from the plan view, wherein the second external marks and second internal marks together form a second alignment structure.

2. The semiconductor package of claim 1, wherein the first external marks contact the second external marks, respectively.

3. The semiconductor package of claim 1,
wherein, in a direction perpendicular to the first outer surface of the first semiconductor chip the first internal marks is disposed to overlap the first gap between the first center portion and first ring portion of the first external marks, and
wherein, in a direction perpendicular to the second outer surface of the second semiconductor chip, the second internal mark is disposed to overlap the second gap between the second center portion and second ring portion of the second external marks.

4. The semiconductor package of claim 3,
wherein the first internal mark has a width equal to or greater than a width of the first gap in a direction parallel to the first outer surface of the first semiconductor chip, and
wherein the second internal mark has a width equal to or greater than a width of the second gap in a direction parallel to the second outer surface of the second semiconductor chip.

5. The semiconductor package of claim 1, wherein outer surfaces of the first external marks and an outer surface of the first internal mark are directed toward the second outer surface of the second semiconductor chip, and are combined to form the first alignment structure having a predetermined projected planar shape.

6. The semiconductor package of claim 5, wherein the predetermined projected planar shape is projected onto a plane parallel to the first outer surface of the first semiconductor chip, and has a diameter or a width in a direction parallel to the first outer surface of the first semiconductor chip of 10 μm or more.

7. The semiconductor package of claim 5, wherein outer surfaces of the second external marks and the outer surface of the second internal mark are directed toward the first outer surface of the first semiconductor chip, and are combined to form the second alignment structure having a projected planar shape corresponding to the first alignment structure.

8. The semiconductor package of claim 1,
wherein the first external marks occupy a planar area larger than a planar area occupied by the first internal mark on a plane parallel to the first outer surface of the first semiconductor chip, and
wherein the second external marks occupy a planar area larger than a planar area occupied by the second internal mark on a plane parallel to the second outer surface of the second semiconductor chip.

9. The semiconductor package of claim 1,
wherein the first bonding layer further includes a first external pad disposed in the first outermost insulating layer and spaced apart from the first external marks, and
wherein the second bonding layer further includes a second external pad disposed in the second outermost insulating layer and spaced apart from the second external marks.

10. The semiconductor package of claim 1, wherein the first external marks are electrically isolated from any active or passive circuit components of the first semiconductor chip, and the second external marks are electrically isolated from any active or passive circuit components of the second semiconductor chip.

11. A semiconductor package, comprising:
a first semiconductor chip including a first substrate and a first bonding layer disposed on the first substrate, and having an upper surface provided by the first bonding layer; and
a second semiconductor chip disposed on the upper surface of the first semiconductor chip, including a second substrate and a second bonding layer disposed below the second substrate, and having a lower surface provided by the second bonding layer and in contact with the upper surface of the first semiconductor chip,
wherein the first bonding layer includes first external marks and a first external pad providing the upper surface, the first external marks and the first external pad electrically insulated from each other, and the first external marks include concentric portions that include a center portion and a ring portion surrounding the center portion with a gap between the center portion and the ring portion,
wherein the second bonding layer includes second external marks and a second external pad providing the lower surface, the second external marks and the second external pad electrically insulated from each other, and the second external marks include concentric portions that include a center portion and a ring portion surrounding the center portion with a gap between the center portion and the ring portion, and
wherein a difference between a width in a first horizontal direction of the first external marks and a width in the first horizontal direction of the first external pad is 20% or less and a difference between a width in the first horizontal direction of the second external marks and a width in the first horizontal direction of the second external pad is 20% or less.

12. The semiconductor package of claim 11,
wherein each of the first external marks has a width in the first horizontal direction the same as the width in the first horizontal direction of the first external pad, and
wherein each of the second external marks has a width in the first horizontal direction the same as the width in the first horizontal direction of the second external pad.

13. The semiconductor package of claim 11,
wherein the first external marks contact the second external marks, respectively, and
wherein the first external pad contacts the second external pad.

14. The semiconductor package of claim 11,
wherein the first bonding layer further includes a first internal mark between the center portion and the ring portion of the first external marks and below the first external marks, and wherein the second bonding layer further includes a second internal mark between the center portion and the ring portion of the second external marks.

15. The semiconductor package of claim 11,
wherein a width in the first horizontal direction of a first spacing between the first external marks is equal to or greater than the width in the first horizontal direction of the first external marks, and
wherein a width in the first horizontal direction of a second spacing between the second external marks is equal to or greater than the width in the first horizontal direction of the second external marks.

16. A semiconductor package, comprising:
a first semiconductor chip including a first substrate and a first bonding layer disposed on the first substrate, and having a flat upper surface provided by the first bonding layer; and
a second semiconductor chip disposed on the upper surface of the first semiconductor chip, including a second substrate and a second bonding layer disposed below the second substrate, and having a lower surface provided by the second bonding layer and contacting the upper surface of the first semiconductor chip,
wherein the first bonding layer includes a first alignment structure having first external marks providing the upper surface and including concentric portions having a first gap therebetween, and a first internal mark disposed in the first gap when viewed from a plan view, below the first external marks, and a first pad structure having a first external pad electrically insulated from the first external marks, and
wherein the first alignment structure has a planar area larger than a planar area of the first external pad, when both are projected onto a plane parallel to the upper surface of the first semiconductor chip.

17. The semiconductor package of claim 16, wherein the first alignment structure has a planar shape when projected onto the plane parallel to the upper surface of the first semiconductor chip, in which the first external marks and the first internal mark are combined with each other, on the plane.

18. The semiconductor package of claim 17, wherein the planar shape projected onto the plane parallel to the upper surface of the first semiconductor chip has a diameter or a width in a first direction parallel to the plane of 10 μm or more.

19. The semiconductor package of claim 16,
wherein the second bonding layer includes a second alignment structure having second external marks providing the lower surface and including concentric portions having a second gap therebetween, and a second internal mark disposed in the second gap when viewed from a plan view, on the second external marks, and a second pad structure having a second external pad electrically insulated from the second external marks and the second internal mark, and
wherein the second alignment structure has a planar area larger than a planar area of the second external pad, when both are projected onto a plane parallel to the lower surface of the second semiconductor chip.

20. The semiconductor package of claim 19, wherein the second alignment structure has a planar shape corresponding to the first alignment structure, when projected onto the plane parallel to the upper surface of the first semiconductor chip.

* * * * *